United States Patent
Wu

(10) Patent No.: US 7,471,568 B2
(45) Date of Patent: Dec. 30, 2008

(54) MULTI-LEVEL CELL MEMORY STRUCTURES WITH ENLARGED SECOND BIT OPERATION WINDOW

(75) Inventor: Chao-I Wu, Zhubei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/614,916

(22) Filed: Dec. 21, 2006

(65) Prior Publication Data

US 2007/0297227 A1 Dec. 27, 2007

Related U.S. Application Data

(60) Provisional application No. 60/805,445, filed on Jun. 21, 2006.

(51) Int. Cl.
*G11C 16/04* (2006.01)
(52) U.S. Cl. .............................. 365/185.24; 365/185.03; 365/185.18
(58) Field of Classification Search ............. 365/185.24
See application file for complete search history.

(56) References Cited

U.S. PATENT DOCUMENTS

| | | | |
|---|---|---|---|
| 5,315,145 A | 5/1994 | Lukaszek | |
| 5,319,229 A | 6/1994 | Shimoji et al. | |
| 5,379,254 A | 1/1995 | Chang | |
| 5,963,480 A | 10/1999 | Harari | |
| 6,011,725 A | 1/2000 | Eitan | |
| 6,172,368 B1 | 1/2001 | Tarr et al. | |
| 6,320,786 B1 | 11/2001 | Chang et al. | |
| 6,324,099 B1 | 11/2001 | Iijima et al. | |
| 6,487,114 B2 | 11/2002 | Jong et al. | |
| 6,541,816 B2 | 4/2003 | Ramsbey et al. | |
| 6,576,922 B1 | 6/2003 | Ma et al. | |
| 6,707,078 B1 | 3/2004 | Shiraiwa et al. | |

(Continued)

FOREIGN PATENT DOCUMENTS

JP 11040682 2/1999

(Continued)

OTHER PUBLICATIONS

U.S. Appl. No. 60/805,448, filed Jun. 21, 2006 by inventor Chao-I Wu entitled "*Method and Structure for Operating Memory Devices on Fringes of Control Gate.*"

(Continued)

*Primary Examiner*—Son L Mai
(74) *Attorney, Agent, or Firm*—Haynes Beffel & Wolfeld LLP

(57) ABSTRACT

Multi-level cell memory devices comprise a charge trapping structure with an enlarged second bit operation window formed by hole injection through a gate electrode or substrate for producing multiple logic levels on each storage side of the charge trapping structure. A hole injection process is conducted through either a gate electrode or substrate to cause fringe-induced effect. Hole charges are stored in a charge trapping layer that intersects with a word line and the hole charges are stored along fringes of the word line. Each memory cell in the MLC memory device includes a total of 2 m bits with m bits for each side of the memory cell, a total of $2*2^m$ multiple voltage threshold Vt distributions with $2^m$ multiple voltage threshold Vt distributions for each side of the memory cell, and a total of $2*2^m$ logic states with $2^m$ logic states for each side of the memory cell.

10 Claims, 20 Drawing Sheets

U.S. PATENT DOCUMENTS

| | | | |
|---|---|---|---|
| 6,768,165 B1 | 7/2004 | Eitan et al. | |
| 6,784,483 B2 | 8/2004 | Chen et al. | |
| 6,834,012 B1 | 12/2004 | He et al. | |
| 7,075,828 B2 * | 7/2006 | Lue et al. | 365/185.24 |
| 7,082,057 B2 * | 7/2006 | Shibata et al. | 365/185.2 |
| 7,130,215 B2 * | 10/2006 | Yeh | 365/185.01 |
| 7,142,455 B1 * | 11/2006 | Lee et al. | 365/185.19 |
| 7,206,225 B2 * | 4/2007 | Wu | 365/185.03 |
| 7,209,390 B2 | 4/2007 | Lue et al. | |
| 7,292,478 B2 | 11/2007 | Yu et al. | |
| 7,307,888 B2 * | 12/2007 | Yeh et al. | 365/185.26 |
| 7,315,474 B2 | 1/2008 | Lue et al. | |
| 2002/0118570 A1 | 8/2002 | Iijima | |
| 2003/0095441 A1 | 5/2003 | Miida | |
| 2004/0136240 A1 * | 7/2004 | Zheng et al. | 365/185.29 |
| 2005/0006696 A1 | 1/2005 | Noguchi et al. | |
| 2005/0111257 A1 | 5/2005 | Eitan | |
| 2005/0237801 A1 * | 10/2005 | Shih | 365/185.11 |
| 2006/0018153 A1 | 1/2006 | Lusky et al. | |
| 2006/0141709 A1 * | 6/2006 | Lung et al. | 438/261 |
| 2006/0221714 A1 | 10/2006 | Li et al. | |
| 2006/0231888 A1 | 10/2006 | Yang et al. | |
| 2007/0029625 A1 | 2/2007 | Lue et al. | |
| 2007/0081387 A1 | 4/2007 | Lung | |
| 2007/0121380 A1 | 5/2007 | Thomas | |
| 2007/0138539 A1 | 6/2007 | Wu et al. | |
| 2007/0267687 A1 | 11/2007 | Lue | |
| 2007/0297240 A1 | 12/2007 | Wu | |
| 2007/0297243 A1 | 12/2007 | Wu | |
| 2007/0297244 A1 | 12/2007 | Wu | |
| 2008/0121980 A1 | 5/2008 | Wu | |

OTHER PUBLICATIONS

Lue et al., "BE-SONOS: A Bandgap Engineered SONOS with Excellent Performance and Reliability," IEDM Tech Digest, IEEE Int'l Dec. 2005, 547-550.

Office Action mailed Jun. 13, 2007 in U.S. Appl. No. 11/425,482, 11 pages.

Office Action mailed Mar. 5, 2008 in U.S. Appl. No. 11/425,482, 8 pages.

Office Action mailed Mar. 10, 2008 in U.S. Appl. No. 11/425,541, 9 pages.

Office Action mailed Apr. 30, 2008 in U.S. Appl. No. 11/425,523, 8 pages.

Office Action mailed May 23, 2008 in U.S. Appl. No. 11/425,553, 9 pages.

* cited by examiner

MULTI-LEVEL CELL MEMORY STRUCTURES WITH ENLARGED SECOND BIT OPERATION WINDOW

REFERENCE TO RELATED APPLICATION

This application claims the benefit of U.S. Provisional Patent Application No. 60/805,445, filed 21 Jun. 2006, entitled Multi-Level Cell Memory Structures with Enlarged Second Bit Operation Window, by inventor Chao-I Wu.

BACKGROUND OF THE INVENTION

1. Field of the Invention

The present invention relates generally to electrically programmable and erasable memory, and more particularly, to methods and devices for increasing a memory operation window and reducing a second bit effect in multi-bit-per-cell operations.

2. Description of Related Art

Electrically programmable and erasable nonvolatile memory technologies based on charge storage structures known as Electrically Erasable Programmable Read-Only Memory (EEPROM) and flash memory are used in a variety of modern applications. A flash memory is designed with an array of memory cells that can be independently programmed and read. Sense amplifiers in a flash memory are used to determine the data value or values stored in a nonvolatile memory. In a typical sensing scheme, an electrical current through the memory cell being sensed is compared to a reference current by a current sense amplifier.

A number of memory cell structures are used for EEPROM and flash memory. As the dimensions of integrated circuits shrink, greater interest is arising for memory cell structures based on charge trapping dielectric layers, because of the scalability and simplicity of the manufacturing processes. Memory cell structures based on charge trapping dielectric layers include structures known by the industry names SONOS, and PHINES, for example. These memory cell structures store data by trapping charge in a charge trapping dielectric layer, such as silicon nitride. As negative charge is trapped, the threshold voltage of the memory cell increases. The threshold voltage of the memory cell is reduced by removing negative charge from the charge trapping layer.

Charge trapping memory devices use a relatively thick bottom oxide, e.g. greater than 3 nanometers, and typically about 5 to 9 nanometers, to prevent charge loss. Instead of direct tunneling, band-to-band tunneling induced hot hole injection BTBTHH can be used to erase the cell. However, the hot hole injection causes oxide damage, leading to charge loss in the high threshold cell and charge gain in the low threshold cell. Moreover, the erase time must be increased gradually during program and erase cycling due to the hard-to-erase accumulation of charge in the charge trapping structure. This accumulation of charge occurs because the hole injection point and electron injection point do not coincide with each other, and some electrons remain after the erase pulse. In addition, during the sector erase of a charge trapping memory flash memory device, the erase speed for each cell is different because of process variations (such as channel length variation). This difference in erase speed results in a large Vt distribution of the erase state, where some of the cells become hard to erase and some of them are over-erased. Thus the target threshold Vt window is closed after many program and erase cycles and poor endurance is observed. This phenomenon will become more serious as the technology keeps scaling down.

A traditional floating gate device stores 1 bit of charge in a conductive floating gate. The advent of charge trapping memory cells provides the ability to store 2 bits of flash cells in an Oxide-Nitride-Oxide (ONO) dielectric. In a typical structure of a charge trapping memory cell, a nitride layer is used as a trapping material positioned between a top oxide layer and a bottom oxide layer. The charge in the ONO dielectric with a nitride layer may be trapped on either the left side or the right side of a charge trapping memory cell. The interaction of the left bit and the right bit, also known as a second bit effect, limits a voltage threshold window between programmed and erased states. The second bit effect consequently affects the size of an operation window, which in turn potentially caps the scalability on the number of bits in the charge trapping memory cells. Therefore, it is desirable to have methods and devices that reduce the second bit effect and thereby increase a memory operation window in a charge trapping memory.

SUMMARY OF THE INVENTION

In the present invention, multi-level cell (MLC) memory devices comprise a charge trapping structure with an enlarged second bit operation window which is created by hole injection through a gate electrode or substrate that allows for multiple logic levels on each storage side of the charge trapping structure. A hole injection process is conducted through either a gate electrode or substrate by using a technique such as Fowler-Nordheim tunneling, and holes are trapped in a charge trapping structure so that there is a negative threshold voltage along fringes of word lines, which may be referred to as fringe-induced effect. The fringe-induced effect occurs in areas underneath a word line so that when a hole injection method is applied to a memory device, hole charges are stored in the charge trapping layer that intersects with a word line and the hole charges are stored along fringes of the word line. Each memory cell in the MLC memory device includes a total of 2 m bits with m bits on each side of the memory cell, a total of $2*2^m$ multiple voltage threshold Vt distributions with $2^m$ multiple voltage threshold Vt distributions for each side of the memory cell, and a total of $2*2^m$ logic states with $2^m$ logic states for each side of the memory cell.

In a first embodiment of the MLC memory device, the memory device comprises two bits for each memory cell where each memory cell has one bit on a left side storage and one bit on a right side storage, four voltage threshold states with two voltage threshold states for the left side storage and two voltage threshold states for the right side storage, and four logic states with two logic states for the left side storage and two logic states for the right side storage. In a second embodiment of the MLC memory device, the memory device comprises four bits for each memory cell where each memory cell has two bits on a left side storage and two bits on a right side storage, eight voltage threshold states with four voltage threshold states for the left side storage and four voltage threshold states for the right side storage, and eight logic states with four logic states for the left side storage and four logic states for the right side storage.

In a third embodiment of the MLC memory device, the memory device comprises six bits for each memory cell where each memory cell has three bits on a left side storage and three bits on a right side storage, sixteen voltage threshold states with eight voltage threshold states for the left side storage and eight voltage threshold states for the right side storage, and sixteen logic states with eight logic states for the left side storage and eight logic states for the right side storage. In a fourth embodiment of the MLC memory device, the memory device comprises eight bits for each memory cell where each memory cell has four bits on a left side storage and four bits on a right side storage, thirty-two voltage threshold states with sixteen voltage threshold states for the left side storage and sixteen voltage threshold states for the right side storages and thirty-two logic states with sixteen logic states for the left side storage and sixteen logic states for the right side storage.

Charge trapping memory devices and methods are described for increasing a second bit operation window by fringe induced effect. The fringe induced effect occurs in areas underneath a word line so that when a hole injection method is applied to a memory device, hole charges are stored in a charge trapping layer that intersects with a word line and the holes charges are stored along fringes of the word line. In a first embodiment of the charge trapping memory, a virtual ground array comprises a charge trapping layer that is disposed between two dielectrics such that there is not a charge trapping layer over source and drain regions. After a hole injection method is applied to the virtual ground array, the hole charges are stored along fringes of each word line given that the fringes of the word line have a larger electrical field relative to non-fringe areas of the word line. The hole charges along a fringe causes the channel to have a lower voltage threshold Vt. A typical device operation of the virtual memory array is dominated by a low voltage threshold side. In a second embodiment of the charge trapping memory, a virtual ground array comprises a charge trapping layer that extends over source and drain regions. Additional hole charges are injected into the charge trapping layer extends over source and drain regions.

In a third embodiment of the charge trapping memory, the virtual ground array comprises a charge trapping layer that is disposed between two dielectrics such that there is not a charge trapping layer over source and drain regions. The virtual ground array includes a plurality of word lines where each word line includes two fringes and a non-fringe area located between the two fringes. Each word line is associated with two voltage thresholds, a first voltage threshold ($Vt_{fringe}$) is associated with the two fringes of the word line, and a second voltage threshold ($Vt_{non-fringe}$) is associated with the non-fringe area of the word line. The fringe voltage threshold $Vt_{fringe}$ is typically lower than the non-fringe $Vt_{non-fringe}$ voltage threshold. In a fourth embodiment of the charge trapping memory, a virtual ground array comprises a charge trapping layer that extends over source and drain regions. Additional hole charges are injected into the charge trapping layer extends over source and drain regions. Similarly, each word line is associated with two voltage thresholds, a first voltage threshold ($Vt_{fringe}$) associated with the two fringes of the word line, and a second voltage threshold ($Vt_{non-fringe}$) associated with the non-fringe area of the word line. The fringe voltage threshold $Vt_{fringe}$ is typically lower than the non-fringe $Vt_{non-fringe}$ voltage threshold.

A first hole injection method to increase a memory operation window in a two-bit-per-cell memory is described which involves applying a positive gate voltage, +Vg, to erase a memory cell to a negative voltage level. A second hole injection method, to increase the memory operation window in the two-bit-per cell memory, is described which involves applying a negative gate voltage, -Vg, to the two-bit-per-cell memory for erasing the charge trapping memory to a negative voltage level. Alternatively, the charge trapping memory is erased to a voltage level that is lower than an initial voltage threshold level, Vt(i). These two methods of erasing a charge trapping memory to either a negative voltage level or to a voltage level that is less than the initial voltage threshold level, can be performed either before a programming step (i.e., a pre-program erase operation), or after a programming step (i.e., a post-program erase operation).

Two exemplary erase operations are illustrated in the following three embodiments of the present invention. The two erase operations include a hole injection erase operation and a band-to-band hot hole erase operation. In a first embodiment, the charge trapping memory is erased by hole injection using a hole tunneling erase with a positive voltage. In a second embodiment, the charge trapping memory is erased by hole injection using hole tunneling erase with a negative voltage. In a third embodiment, the charge trapping memory is erased using a band-to-band hot hole operation. A programming technique that is suitable for operation with these erase operations of a charge trapping memory includes channel hot electron (CHE) programming.

The methods of the present invention are applied to a wide variety of memory devices that have a charge trapping structure, including but not limited to memory devices having a nitride-oxide structure, an oxide-nitride-oxide structure, a nitride-oxide-nitride-oxide structure and an oxide-nitride-oxide-nitride-oxide structure. For example, in an MNOS memory device, a charge trapping layer overlies a dielectric layer without the presence of a dielectric layer that is disposed over the charge trapping layer. Instead, a poly layer is formed over the charge trapping layer. The nitride-oxide structure without a dielectric layer enables holes to be injected readily from the poly layer to the charge trapping layer.

The structures and methods of the present invention are disclosed in the detailed description below. This summary does not purport to define the invention. The invention is defined by the claims. These and other embodiments, features, aspects, and advantages of the invention will become better understood with reference to the following description, claims and accompanying drawings.

BRIEF DESCRIPTION OF THE DRAWINGS

The invention will be described with respect to specific embodiments thereof, and reference will be made to the drawings, in which.

DETAILED DESCRIPTION

Figure 1:
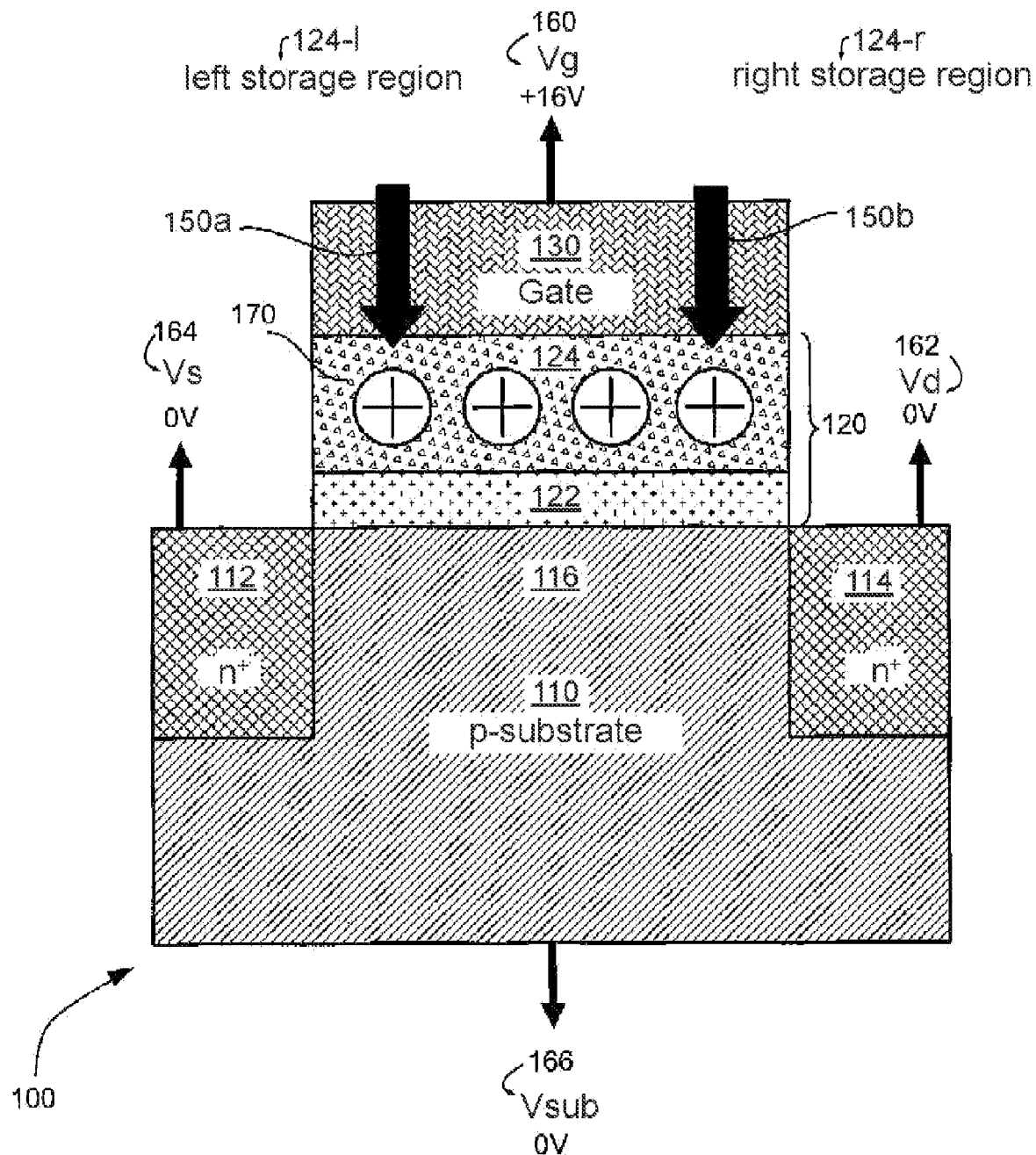
FIG. 1 is a structural diagram in a first embodiment of a charge trapping memory cell that includes a nitride-oxide charge trapping structure without a top dielectric layer showing an erase operation of the charge trapping memory by a hole injection method by injecting holes from a gate electrode in accordance with the present invention.

A description of structural embodiments and methods of the present invention is provided with reference to FIGS. 1-10. It is to be understood that there is no intention to limit the invention to the specifically disclosed embodiments but that the invention may be practiced using other features, elements, methods and embodiments. Like elements in various embodiments are commonly referred to with like reference numerals.

FIG. 1 illustrates a structural diagram in a first embodiment of a charge trapping memory cell 100 that includes a nitride-oxide (NO) charge trapping structure 120 without a top dielectric layer showing an erase operation of the charge trapping memory by a hole injection method by injecting holes from a gate terminal. The charge trapping memory cell 100 comprises a p-substrate 110 with a source region 112 spaced apart from a drain region 114 with a channel 116 therebetween. The term "hole injection" is also referred to as "hole tunneling." The nitride-oxide charge trapping structure 120 has a charge trapping layer 124 overlying a dielectric layer 122, which is disposed over the p-substrate 110. The nitride-oxide charge trapping structure 120 does not have a top dielectric structure in this embodiment. A gate electrode 130 overlies the charge trapping layer 124 in the charge trapping structure 120. A wide variety of materials can be used for the gate electrode 130, including n-poly, p-poly and metal.

In this embodiment, a positive gate voltage +Vg 160 is applied to the gate electrode 130 to erase the charge trapping memory cell 100 to a negative voltage level or to a voltage level that is less than the initial voltage threshold level to effectuate a large memory operation window in the charge trapping memory cell 100, which has a left memory storage side 124-l in the left side of the charge trapping layer 124 and a right memory storage side 124-r in the right side of the charge trapping layer 124. This erase method can be conducted either before a programming step (i.e., a pre-program erase operation), or after a programming step (i.e., a post-program erase operation).

When a high bias voltage is applied to a gate terminal in the gate electrode 130, holes 170 are injected from the gate terminal (as indicated by arrows 150a, 150b) the charge trapping layer 124. As exemplary voltage levels, the gate voltage Vg 160 is applied with a positive voltage of 16 volts, a drain voltage Vd 162 is applied with 0 volts, a source voltage Vs 164 is applied with 0 volts, and a substrate voltage Vsub 166 is applied with 0 volts. The combination of these applied voltages results in hole tunneling erase of the charge trapping memory cell 100 to the negative voltage threshold −Vt, thereby increasing a memory operational window and reducing the second bit effect.

The nitride-oxide charge trapping structure 120 in the charge trapping memory cell 100 is intended as an illustration. The charge trapping memory cell 100 comprises the nitride-oxide charge trapping structure 120 without a top oxide, which advantageously allows holes to enter directly into the charge trapping structure 120 without the presence of a top oxide. The nitride-oxide charge trapping structure 120 in the charge trapping memory cell 100 can be used in memories like metal oxide nitride oxide semiconductor (MNOS) or silicon nitride oxide semiconductor (SNOS). Other combinations of charge trapping structures, such as oxide-nitride-oxide (ONO), or oxide-nitride-oxide-nitride-oxide (ON-ONO) stacks can be practiced without departing from the spirit of the present invention.

Figure 2:
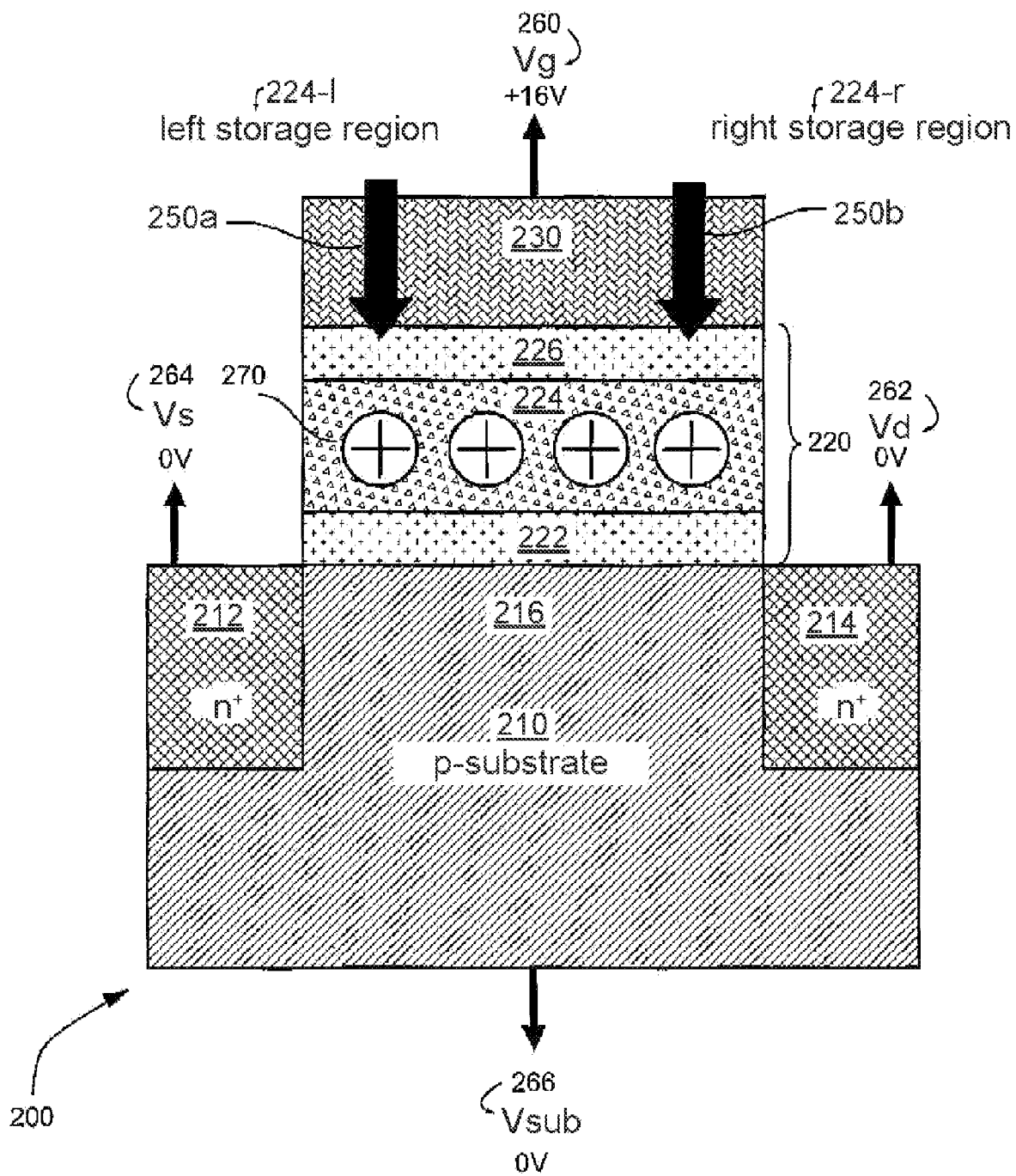
FIG. 2 is a structural diagram illustrating a second embodiment of the charge trapping memory that includes an oxide-nitride-oxide charge trapping structure with a selected top dielectric to allow hole injection from a gate terminal in accordance with the present invention.

FIG. 2 is a structural diagram illustrating a second embodiment of the charge trapping memory 200 that includes an oxide-nitride-oxide (ONO) charge trapping structure 220 with a selected top dielectric layer to allow hole injection from a gate terminal. The charge trapping memory cell 200 comprises a p-substrate 210 with a source region 212 spaced apart from a drain region 214 with a channel 216 therebetween. The nitride-oxide charge trapping structure 220 has a top dielectric layer 226 overlying a charge trapping layer 224, with the charge trapping layer 224 overlying a bottom dielectric layer 222, which is disposed over the p-substrate 210. A gate electrode 230 overlies the top dielectric layer 226 in the charge trapping structure 120. A wide variety of materials can be used for the gate electrode 130, including n-poly, p-poly and metal.

In this embodiment, a positive gate voltage +Vg 260 is applied to the gate electrode 230 to erase the charge trapping memory cell 200 to a negative voltage level or to a voltage level that is less than the initial voltage threshold level to effectuate a large memory operation window in the charge trapping memory cell 200, which has a left memory storage side 224-$l$ in the left side of the charge trapping layer 124 and a right memory storage side 224-$r$ in the right side of the charge trapping layer 124. This erase method can be conducted either before a programming step (i.e., a pre-program erase operation), or after a programming step (i.e., a post-program erase operation).

When a high bias voltage is applied to a gate terminal in the gate electrode 230, holes 270 are injected from the gate terminal to the charge trapping layer 224, as indicated by arrows 250$a$, 250$b$. The top dielectric layer 226 may be selected to be sufficiently thin for hole tunneling through the top dielectric layer 214. As exemplary voltage levels, the gate voltage Vg 260 is applied with a positive voltage of 16 volts, a drain voltage Vd 262 is applied with 0 volts, a source voltage Vs 264 is applied with 0 volts, and a substrate voltage Vsub 266 is applied with 0 volts. The combination of these applied voltages results in hole tunneling erase of the charge trapping memory cell 200 to the negative voltage threshold −Vt, thereby increasing a memory operational window and reducing the second bit effect.

The oxide-nitride-oxide charge trapping structure 220 in the charge trapping memory cell 200 is intended as an illustration. The oxide-nitride-oxide charge trapping structure 220 in the charge trapping memory cell 200 can be used in memories like metal oxide-nitride-oxide semiconductor (MONOS) or silicon nitride oxide semiconductor (SONOS). Other combinations of charge trapping structures, such as oxide-nitride-oxide-nitride-oxide stack, can be practiced without departing from the spirit of the present invention.

Figure 3:
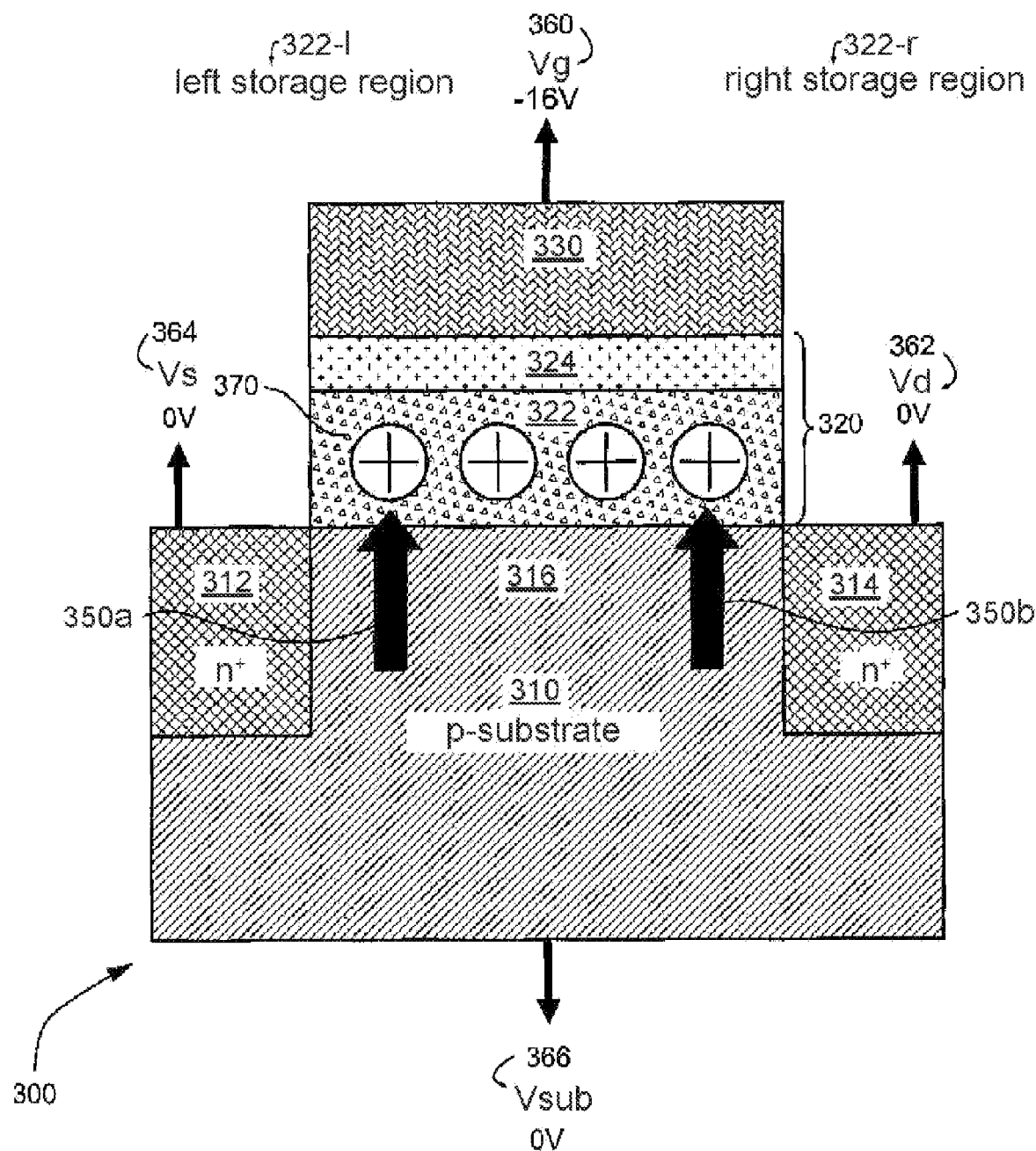
FIG. 3 is a structural diagram illustrating a third embodiment of the charge trapping memory cell that includes an oxide-nitride charge trapping structure without a bottom dielectric layer to allow hole injection from the substrate in accordance with the present invention.

FIG. 3 is a structural diagram illustrating a third embodiment of the charge trapping memory cell 300 that includes an oxide-nitride (ON) charge trapping structure 320 without a bottom dielectric layer to allow hole injection from the substrate. The charge trapping memory cell 300 comprises a p-substrate 310 with a source region 312 spaced apart from a drain region 314 with a channel 316 therebetween. The nitride-oxide charge trapping structure 320 has a dielectric layer 324 overlying a charge trapping layer 322, which is disposed over the p-substrate 110. The oxide-nitride charge trapping structure 320 does not have a bottom dielectric structure in this embodiment. A gate electrode 330 overlies the charge trapping layer 322 in the charge trapping structure 320. A wide variety of materials can be used for the gate electrode 330, including n-poly, p-poly and metal.

In this embodiment, a negative gate voltage −Vg 360 is applied to the gate electrode 330 to erase the charge trapping memory cell 300 to a negative voltage level or to a voltage level that is less than the initial voltage threshold level to effectuate a large memory operation window in the charge trapping memory cell 300, which has a left memory storage side 322-$l$ in the left side of the charge trapping layer 322 and a right memory storage side 322-$r$ in the right side of the charge trapping layer 322. This erase method can be conducted either before a programming step (i.e., a pre-program erase operation), or after a programming step (i.e., a post-program erase operation).

When a high bias voltage is applied to a gate terminal in the gate electrode 330, holes 370 are injected from the substrate to the charge trapping layer 322, as indicated by arrows 350$a$, 350$b$. As exemplary voltage levels, the gate voltage −Vg 360 is applied with a negative voltage of −16 volts, a drain voltage Vd 362 is applied with 0 volts, a source voltage Vs 364 is applied with 0 volts, and a substrate voltage Vsub 366 is applied with 0 volts. The combination of these applied voltages results in hole tunneling erase of the charge trapping memory cell 300 to the negative voltage threshold −Vt, thereby increasing a memory operational window and reducing the second bit effect.

The oxide-nitride charge trapping structure 320 in the charge trapping memory cell 300 is intended as an illustration. The charge trapping memory cell 300 has the oxide-nitride charge trapping structure 320 without a bottom oxide, which advantageously allows holes to enter directly into the charge trapping structure 320 without the presence of a bottom oxide. The oxide-nitride charge trapping structure 320 in the charge trapping memory cell 300 can be used in memories like metal oxide nitride oxide semiconductor (MONS) or silicon nitride oxide semiconductor (SONS). Other combinations of charge trapping structures, such as oxide-nitride-oxide, or oxide-nitride-oxide-nitride-oxide stack can be practiced without departing from the spirit of the present invention.

Figure 4:
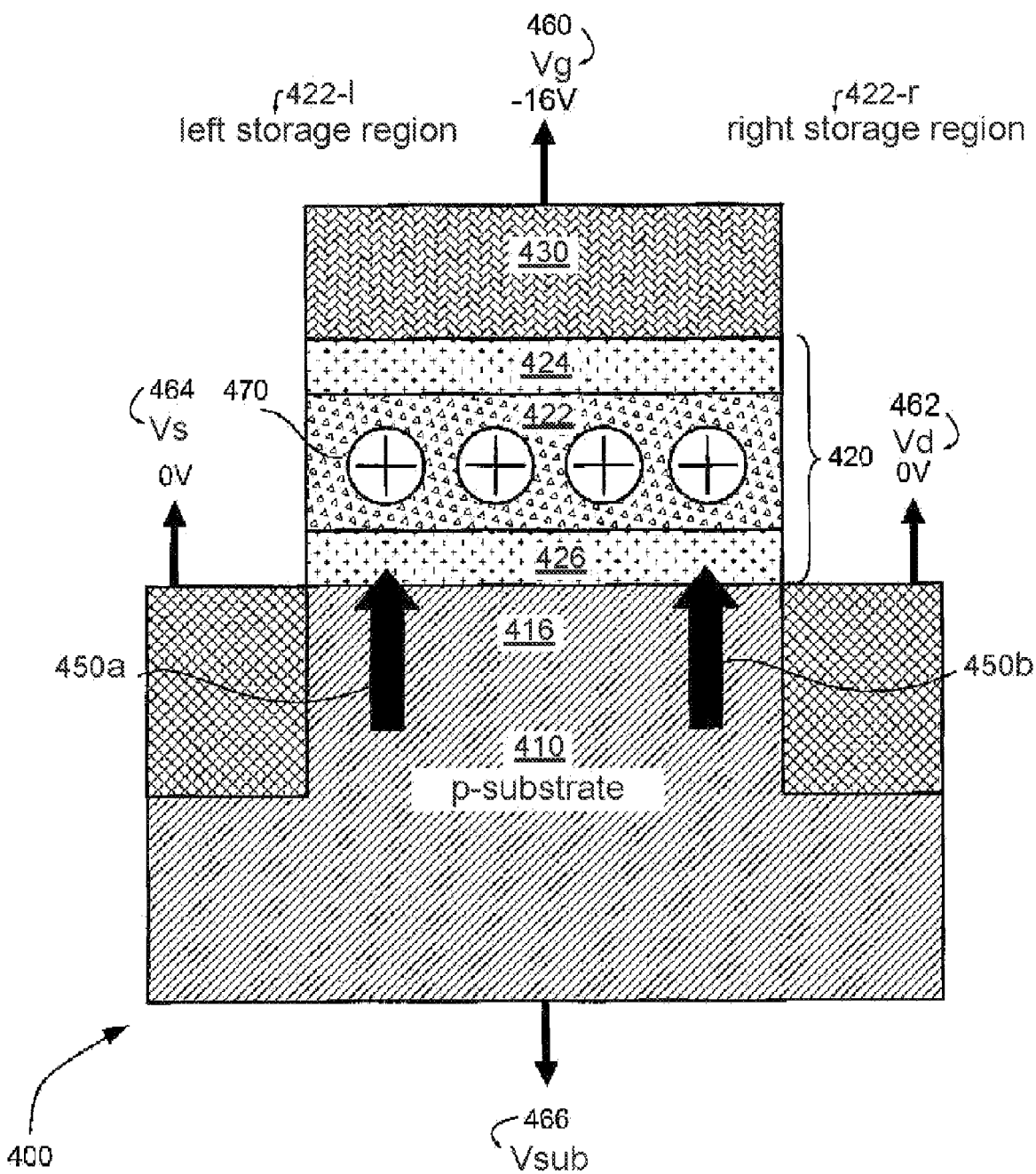
FIG. 4 is a structural diagram illustrating a fourth embodiment of the charge trapping memory that includes an oxide-nitride-oxide charge trapping structure with a selected bottom dielectric layer to allow hole injection from the substrate in accordance with the present invention.

FIG. 4 is a structural diagram illustrating a fourth embodiment of the charge trapping memory 400 that includes an oxide-nitride-oxide charge trapping structure 420 with a selected bottom dielectric layer to allow hole injection from substrate. The charge trapping memory cell 400 comprises a p-substrate 410 with a source region 412 spaced apart from a drain region 414 with a channel 416 therebetween. The oxide-nitride-oxide charge trapping structure 420, disposed over the p-substrate 410, has a top dielectric layer 424 overlying a charge trapping layer 422 and the charge trapping layer 422 overlying a bottom dielectric layer 426. A gate electrode 430 overlies the top dielectric layer 424 in the charge trapping structure 320. A wide variety of materials can be used for the gate electrode 330, including n-poly, p-poly and metal.

In this embodiment, a negative gate voltage −Vg 460 is applied to the gate electrode 430 to erase the charge trapping memory cell 400 to a negative voltage level or to a voltage level that is less than the initial voltage threshold level to effectuate a large memory operation window in the charge trapping memory cell 400, which has a left memory storage side 422-l in the left side of the charge trapping layer 422 and a right memory storage side 422-r in the right side of the charge trapping layer 422. This erase method can be conducted either before a programming step (i.e., a pre-program erase operation), or after a programming step (i.e., a post-program erase operation).

When a high bias voltage is applied to a gate terminal in the gate electrode 430, holes 470 are injected from the substrate to the charge trapping layer 422, as indicated by arrows 450a, 450b. The bottom dielectric layer 426 may be selected to be sufficiently thin for hole tunneling through the bottom dielectric layer 426. As exemplary voltage levels, the gate voltage −Vg 460 is applied with a negative voltage of −16 volts, a drain voltage Vd 462 is applied with 0 volts, a source voltage Vs 464 is applied with 0 volts, and a substrate voltage Vsub 466 is applied with 0 volts. The combination of these applied voltages results in hole tunneling erase of the charge trapping memory cell 400 to the negative voltage threshold −Vt, thereby increasing a memory operational window and reducing the second bit effect.

The oxide-nitride-oxide charge trapping structure 420 in the charge trapping memory cell 300 is intended as an illustration. The oxide-nitride-oxide charge trapping structure 420 in the charge trapping memory cell 300 can be used in memories like metal oxide nitride oxide semiconductor (MONOS) or silicon nitride oxide semiconductor (SONOS). Other combinations of charge trapping structures, such as oxide-nitride-oxide-nitride-oxide (ONONO) stack can be practiced without departing from the spirit of the present invention. Representative dielectric layers 122, 222, 226, 324, 424, and 426 include silicon dioxide and silicon oxynitride having a thickness of about 5 to 10 nanometers, or other similar high dielectric constant materials including for example $Al_2O_3$. Representative bottom dielectrics include silicon dioxide and silicon oxynitride having a thickness of about 3 to 10 nanometers, or other similar high dielectric constant materials. Representative charge trapping structures include silicon nitride having a thickness of about 3 to 30 nanometers, or other similar high dielectric constant materials, including metal oxides such as $Al_2O_3$, $HfO_2$, $CeO_2$, and others. The charge trapping structure may be a discontinuous set of pockets or particles of charge trapping material, or a continuous layer as shown in the drawing. The charge trapping structure 120 traps charges like electron charges or hole charges.

Figure 5A:
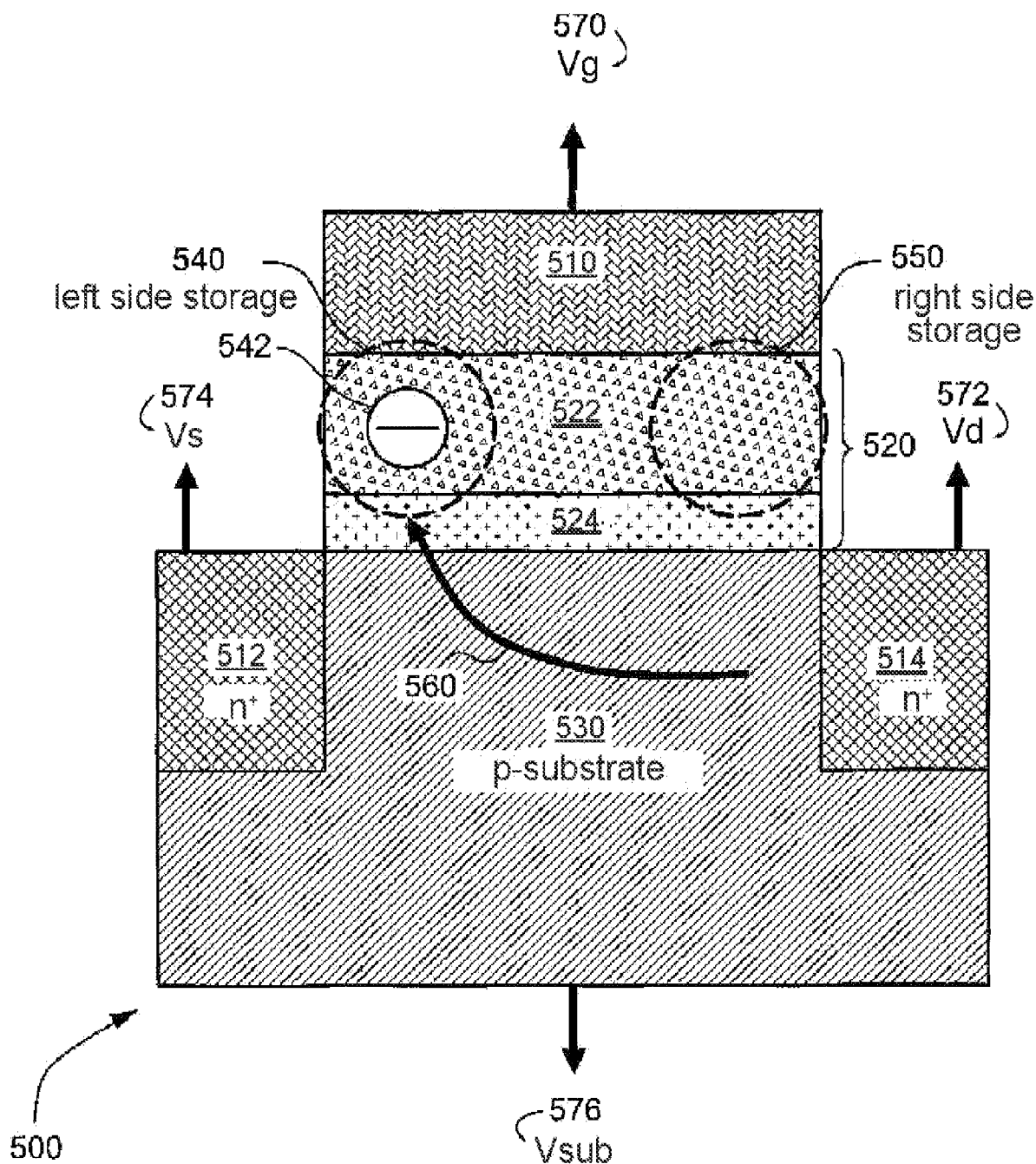
FIG. 5A is a structural diagram illustrating a multi-level cell memory device with m bits per memory cell and $2^m$ Vt states in accordance with the present invention.

FIG. 5A is a structural diagram illustrating a multi-level cell memory device 500 with m bits per memory cell and $2^m$ Vt states. The multi-level cell memory device 500 comprises a gate electrode 510 and a charge trapping structure 520 on a p-substrate 530 with a source region 512 and a drain region 514. Some suitable materials for forming the gate electrode 510 include an n-poly, a p-poly, or a metal gate. If the gate electrode 510 is a p-poly material, the p-poly possesses a desirable hole injection efficiency while electron injection is suppressed. The charge trapping structure 520 comprises a charge trapping layer 522, such as silicon nitride, and a dielectric layer 524, such as oxide, without the presence of a top dielectric layer overlying the charge trapping layer 522. The omission of the top dielectric layer allows hole tunneling to move hole charges more readily from the gate 520 into the charge trapping layer 522. An exemplary thickness, although not intended to be limiting, of the charge trapping layer 522 is about 20 nm to prevent electron back tunneling into the gate electrode 510. The multi-level cell memory device 500 can be formed, for example, with a p-poly nitride-oxide-silicon (PNOS) nMOSFET structure.

The multi-level cell memory device 500 is erased by hole injection using one of the following voltage levels. The multi-level cell memory device 500 is applied with a positive gate voltage, +Vg, to erase multi-level cell memory device 500 to a negative voltage level. The multi-level cell memory device 500 is applied with a negative gate voltage, −Vg, to erase multi-level cell memory device 500 to a negative voltage level. Alternatively, the charge trapping memory is erased to a voltage level that is lower than an initial voltage threshold level, Vt(i). These two methods of erasing a charge trapping memory to either a negative voltage level or to a voltage level that is less than the initial voltage threshold level, can be performed either before a programming step (i.e., a pre-program erase operation), or after a programming step (i.e., a post-program erase operation). After an erase operation, programming of the multi-level cell memory device 500 is typically carried out by channel hot electron programming to store electrons locally in a left side storage 540 and a right side storage 550 in the charge trapping layer 522. As shown in FIG. 5A, a directional arrow 560 indicates that the channel hot electron programming is applied to the left side storage 540, as shown with electrons 542 in the charge trapping structure 522. A similar channel hot electron programming is also applied to the right side storage 550 to program the right side of the multi-level cell memory device 500. The multi-level cell memory device 500 also includes the following terminals for applying voltages: a gate voltage Vg 570, a drain voltage Vd 572, a source voltage Vs 574, and a substrate voltage Vsub 576.

Figure 5B:
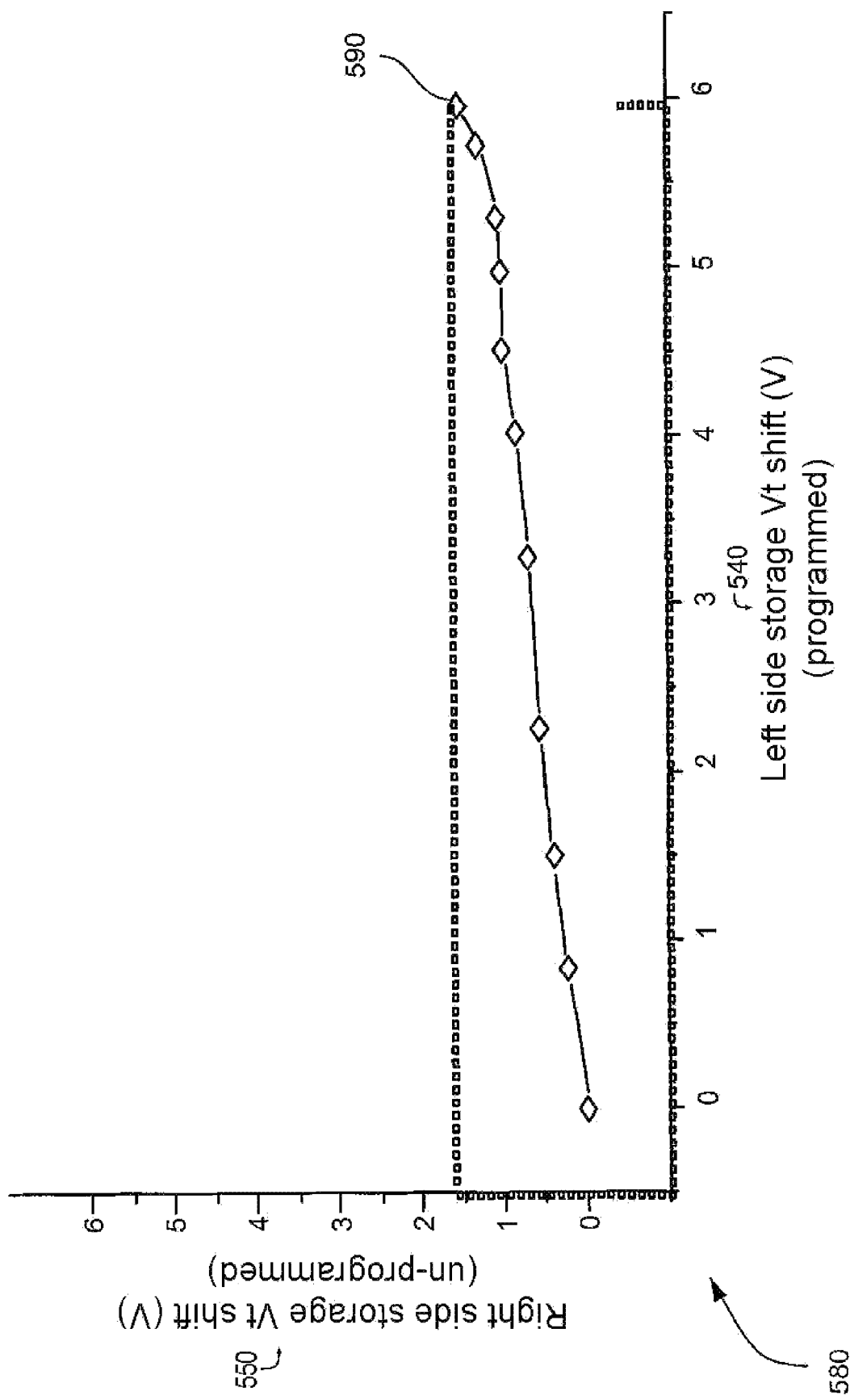
FIG. 5B illustrates a graphical diagram showing a large second bit operation window after hole injection in accordance with the present invention.

FIG. 5B illustrates a graphical diagram 580 showing a large second bit operation window after a hole injection. A second bit operation window relates to a voltage differential between a first side that is programmed, such as a left bit, and a second side that is un-programmed, such as a right bit. In this illustration, the graphical diagram 500 shows a second bit operation window 590 of 4.5 volts, calculated by subtracting the voltage threshold shift of 1.5 volts on the right side to the voltage threshold shift of 6.0 volts on the left side, represented mathematically as 6.0 volts−1.5 volts=4.5 volts. The size of the second bit operation window 590 serves as a parameter for designing the number of m bits per memory cell with $2^m$ number of voltage threshold Vt states in the multi-level cell memory device 500. The left side storage 540 in the multi-level cell memory device 500 can be designed with multiple bits in the four embodiments illustrated below, with one bit for each side and two bits per memory cell in a left side storage 540-1 as illustrated in FIG. 6, with two bits for each side and four bits per memory cell in a left side storage 540-2 as illustrated in FIG. 7, with three bits per side and six bits per memory cell in a left side storage 540-3 as illustrated in FIG. 8, and with four bits per side and eight bits per memory cell in a left side storage 540-4 as illustrated in FIG. 9.

Figure 6:
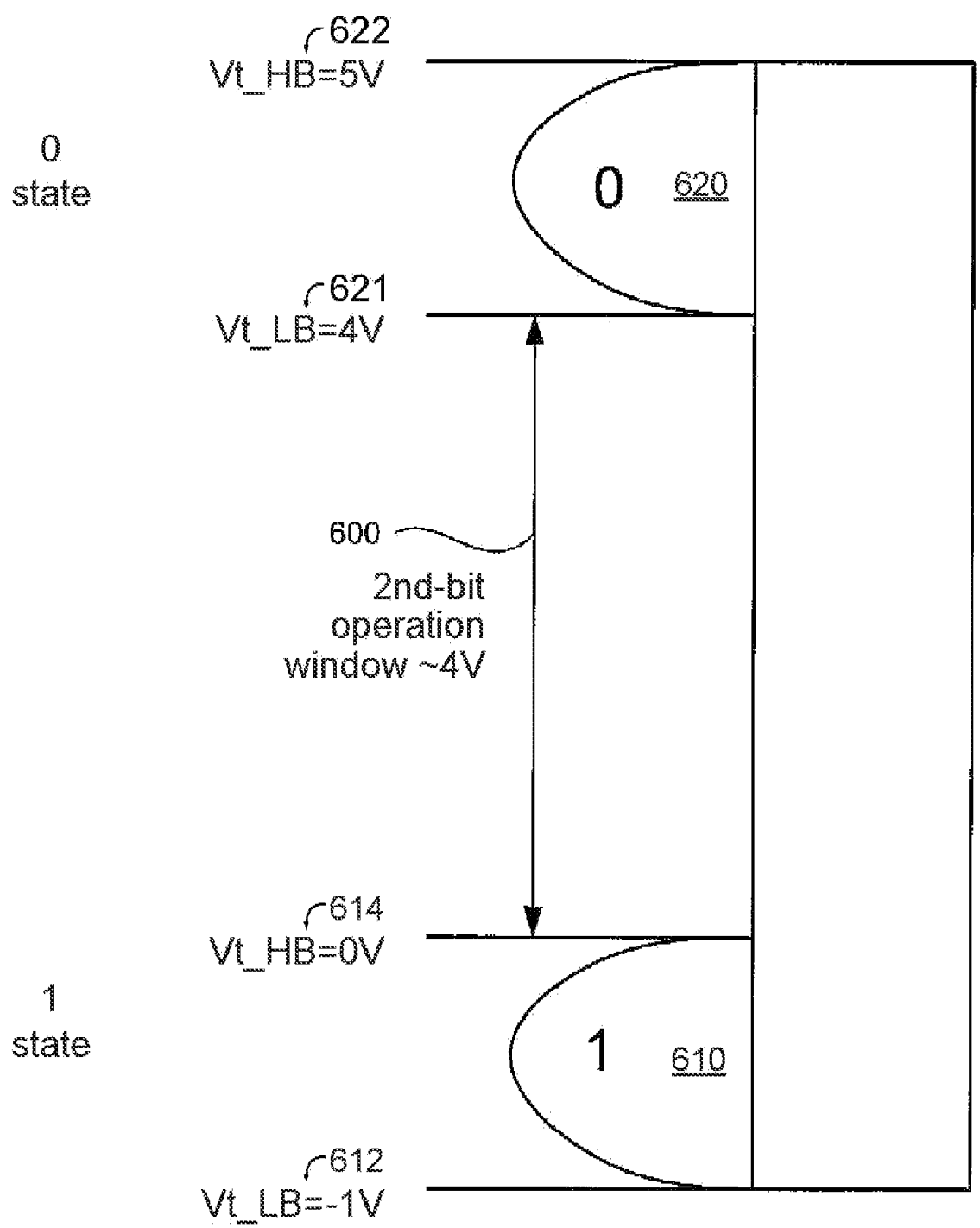
FIG. 6 is a structural diagram illustrating a first embodiment in the left side storage of the multi-level cell memory device designed with one bit for each side, two bits per memory cell, and two voltage threshold Vt states in accordance with the present invention.

FIG. 6 is a structural diagram illustrating a first embodiment in the left side storage 540-1 of the multi-level cell memory device 500 designed with one bit for each side, two bits per memory cell, and two voltage threshold Vt states. The left side storage 540-1 stores one bit of information, which provides two Boolean states, a logic "0" state 620 and a logic "1" state 610. The left bit in the left side storage 540-1 is programmed from the logic 1 state 610 to a logic 0 state 620. The logic 1 state 610 is also referred to as a first voltage threshold state, and the logic 0 state 620 is also referred to as a second voltage threshold state. In the logic 1 state, the voltage threshold ranges between a high voltage threshold Vt_HB 614 of zero volts to a low voltage threshold Vt_LB 612 of −1 volts. In the logic 0 state, the voltage threshold ranges between a low voltage threshold Vt_LB 621 of 4 volts to a high voltage threshold Vt_HB 622 of 5 volts. A second bit operation window 600 of the multi-level cell memory device 500 in this embodiment is about 4 volts. A similar type of description is also applicable to a right side storage in the multi-level cell memory device 500. The multi-level cell memory device 500 has a total of two bits, a first bit on the left side and a second bit on the right side.

Figure 7:
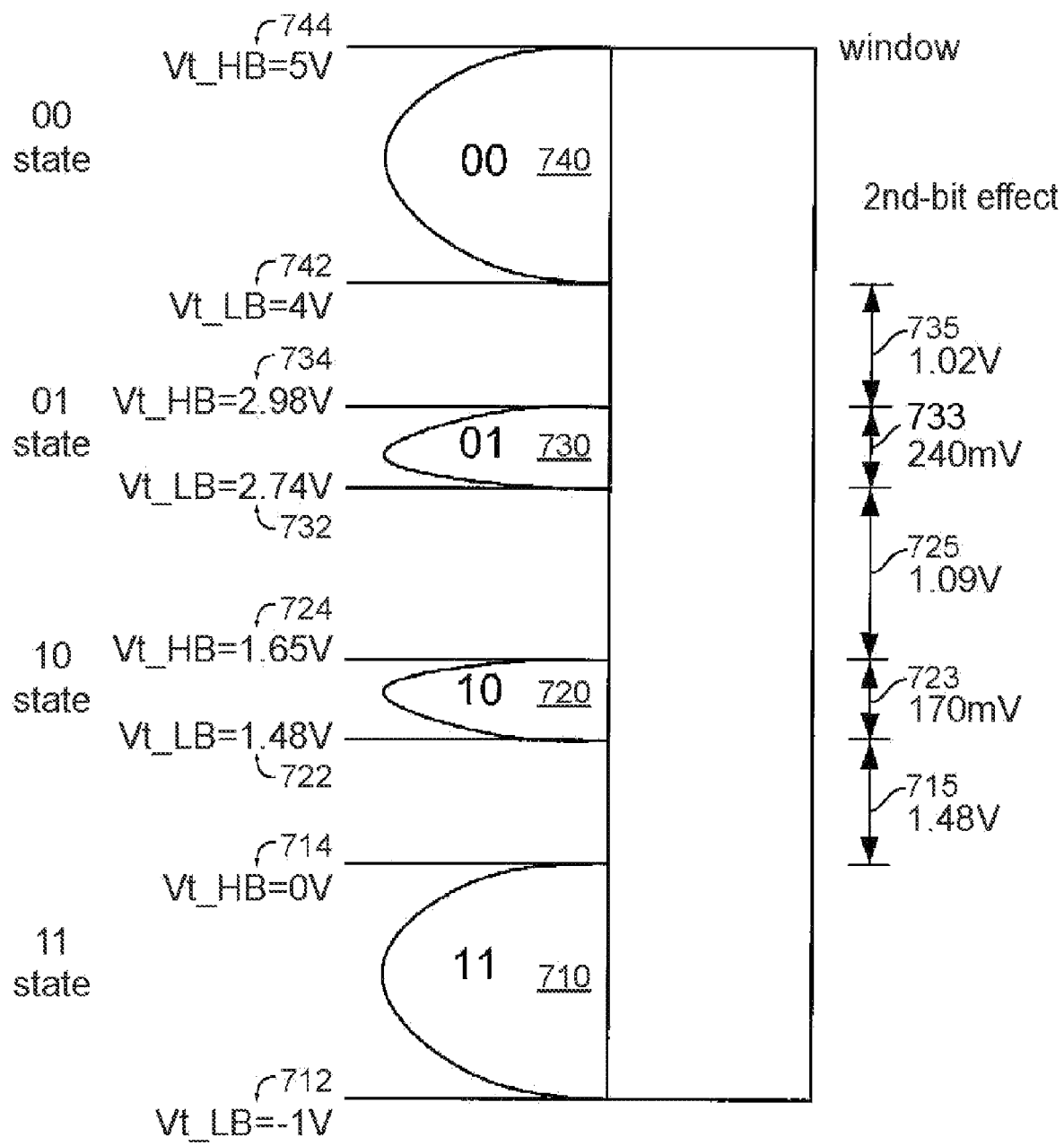
FIG. 7 is a structural diagram illustrating the left side storage in the multi-level cell memory device designed with two bits for each side, four bits per memory cell, and four voltage threshold Vt states in accordance with the present invention.

FIG. 7 is a structural diagram illustrating the left side storage 540-2 in the multi-level cell memory device 500 designed with two bits for each side, four bits per memory cell, and four voltage threshold Vt states. The left side storage 540-2 stores two bits of information, which provides four Boolean states, a logic "00" state 740, a logic "01" state 730, a logic "10" state 720, and a logic "11" state 710. The two bits in the left side storage 540-2 are programmed from the logic 11 state 710 to a logic 00 state 740. The logic 11 state 710 is also referred to as a first voltage threshold state, the logic 10 state 720 is also referred to as a second voltage threshold state, the logic 01 state 730 is also referred to as a third voltage threshold state, and the logic 00 state 740 is also referred to as a fourth voltage threshold state. In the logic 11 state, the voltage threshold ranges between a high voltage threshold Vt_HB 714 of zero volts to a low voltage threshold Vt_LB 712 of —1 volts. In the logic 10 state, the voltage threshold ranges between a high voltage threshold Vt_HB 724 of 1.65 volts to a low voltage threshold Vt_LB 722 of 1.48 volts, which produces a bit distribution 723 of about 170 millivolts. A sensing window 715 between the high voltage threshold Vt_HB 714 of the logic 11 state and the low voltage threshold Vt_LB 722 of the logic 110 is about 1.48 volts. In the logic 01 state, the voltage threshold ranges between a high voltage threshold Vt_HB 734 of 2.98 volts to a low voltage threshold Vt_LB 732 of 2.74 volts, which produces a bit distribution 733 of about 240 millivolts. A sensing window 725 between the high voltage threshold Vt_HB 724 of the logic 10 state and the low voltage threshold Vt_LB 732 is about 1.09 volts. In the logic 00 state, the voltage threshold ranges between a low voltage threshold Vt_LB 742 of 4 volts to a high voltage threshold Vt_HB 744 of 5 volts. A sensing window 735 between the high voltage threshold Vt_HB 734 of the logic 11 state and the low voltage threshold Vt_LB 742 of the logic 00 state is about 1.02 volts. A second bit operation window 700 of the multi-level cell memory device 500 in this embodiment is about 4 volts. A similar type of description is also applicable to a right side storage in the multi-level cell memory device 500. The multi-level cell memory device 500 has a total of four bits, a first and second bits on the left side, and a third and fourth bits on the right side.

Figure 8:
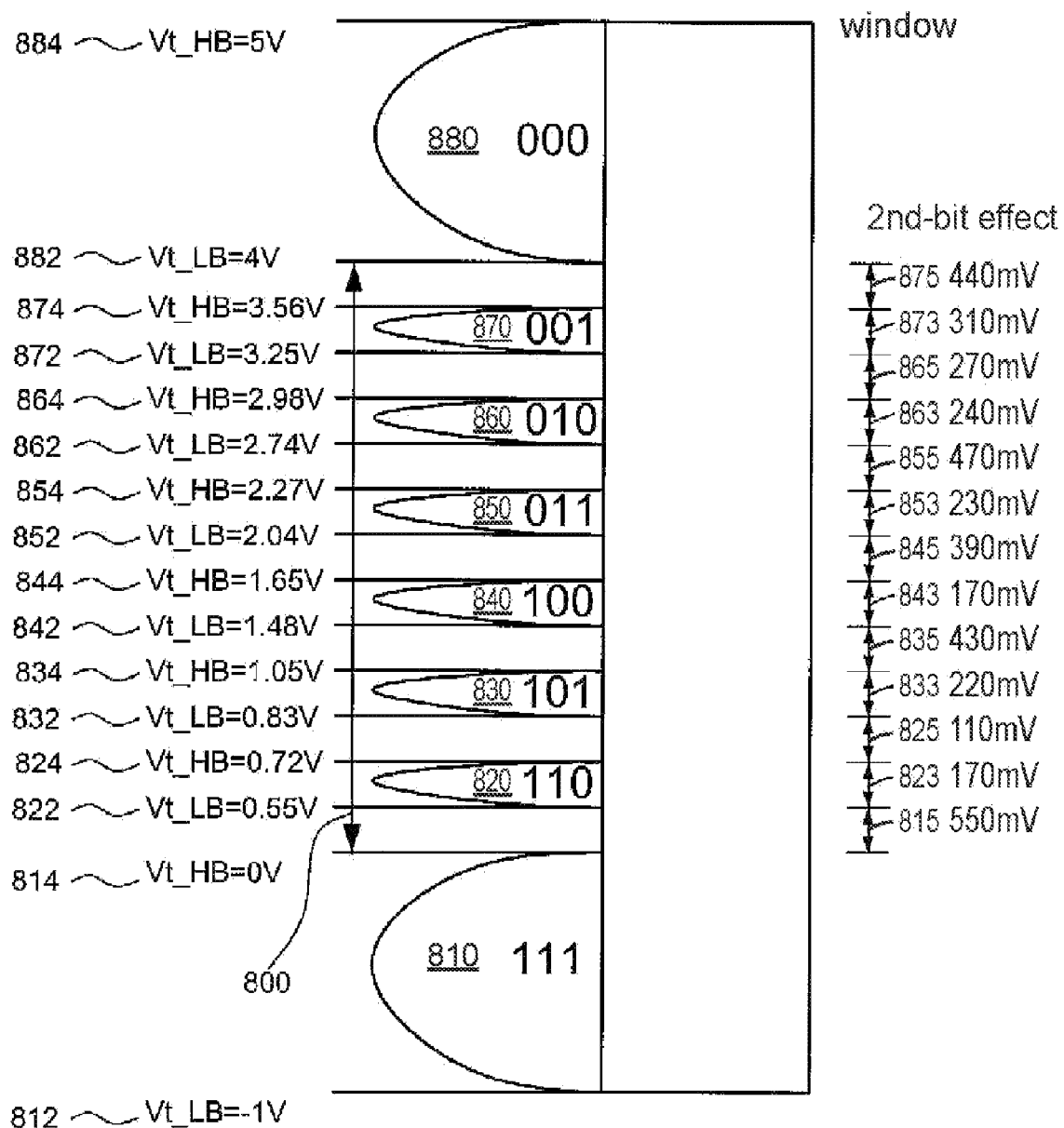
FIG. 8 is a structural diagram illustrating the left side storage in the multi-level cell memory device designed with three bits for each side, six bits per memory cell, and eight voltage threshold Vt states in accordance with the present invention.
Figure 9:
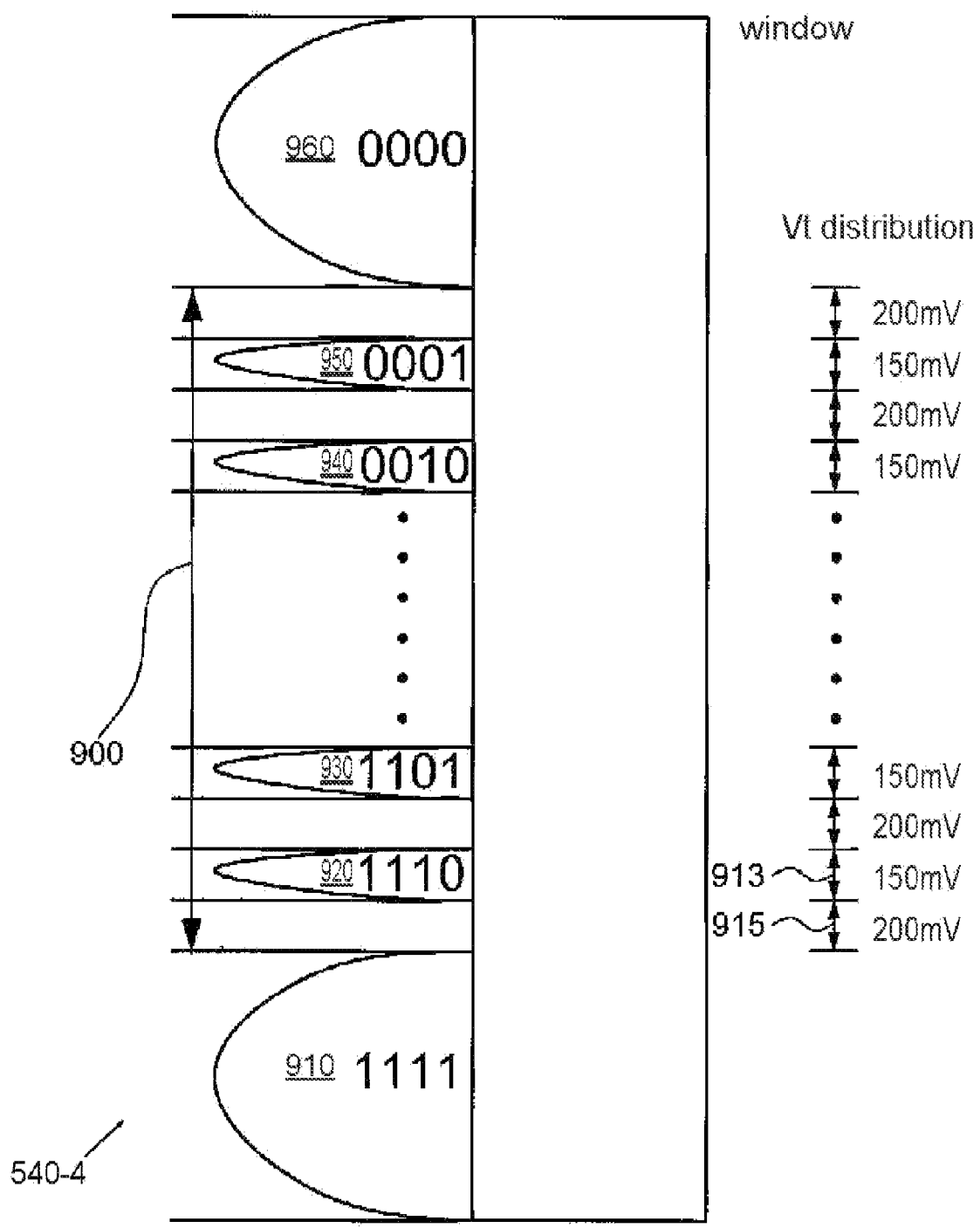
FIG. 9 is a structural diagram illustrating the left side storage in the multi-level cell memory device designed with four bits for each side, eight bits per memory cell, and sixteen voltage threshold Vt states in accordance with the present invention.

FIG. 8 is a structural diagram illustrating the left side storage 540-3 in the multi-level cell memory device 500 designed with three bits for each side, six bits per memory cell, and eight voltage threshold Vt states. The left side storage 540-3 stores three bits of information, which provides eight Boolean states, a logic "000" state 880, a logic "001" state 870 a logic "010" state 860, a logic "011" state 850, a logic "100" state 840, a logic "101" state 830, a logic "110" state 820, and a logic "111" state 810. The three left bits in the left side storage 540-3 are programmed from the logic 111 state 810 to the logic 000 state 880. The logic 111 state 810 is also referred to as a first voltage threshold state, the logic 110 state 820 is also referred to as a second voltage threshold state, the logic 101 state 830 is also referred to as a third voltage threshold state, the logic 100 state 840 is also referred to as a fourth voltage threshold state, the logic 011 state 850 is also referred to as a fifth voltage threshold state, the logic 010 state 860 is also referred to as a sixth voltage threshold state, the logic 001 state 870 is also referred to as a seventh voltage threshold state, and the logic 000 state 880 is also referred to as an eighth voltage threshold state. In the logic 111 state 810, the voltage threshold ranges between a high voltage threshold Vt_HB 814 of zero volts to a low voltage threshold Vt_LB 812 of −1 volts. In the logic 110 state 820, the voltage threshold ranges between a high voltage threshold Vt_HB 824 of 0.72 volts to a low voltage threshold Vt_LB 822 of 0.55 volts, which produces a bit distribution 823 of about 170 millivolts. A sensing window 815 between the high voltage threshold Vt_HB 814 of the logic 111 state and the low voltage threshold Vt_LB 822 of the logic 110 state is about 550 millivolts. In the logic 101 state 830, the voltage threshold ranges between a high voltage threshold Vt_HB 834 of 1.05 volts to a low voltage threshold Vt_LB 832 of 0.83 volts, which produces a bit distribution 833 of about 220 millivolts. A sensing window 825 between the high voltage threshold Vt_HB 824 of the logic 110 state and the low voltage threshold Vt_LB 832 of the logic 101 state is about 110 millivolts. In the logic 100 state 840, the voltage threshold ranges between a high voltage threshold $Vt_{\_HB\ 824\ of}$ 1.65 volts to a low voltage threshold Vt_LB 842 of 1.48 volts, which produces a bit distribution 843 of about 170 millivolts. A sensing window 835 between the high voltage threshold Vt_HB 834 of the logic 101 state and the low voltage threshold Vt_LB 842 of the logic 100 state is about 430 millivolts.

In the logic 011 state 850, the voltage threshold ranges between a high voltage threshold Vt_HB 854 of 2.27 volts to a low voltage threshold Vt_LB 853 of 2.04 volts, which produces a bit distribution 853 of about 230 millivolts. A sensing window 845 between the high voltage threshold Vt_HB 844 of the logic 100 state and the low voltage threshold Vt_LB 852 of the logic 011 state is about 390 millivolts. In the logic 010 state 860, the voltage threshold ranges between a high voltage threshold Vt_HB 864 of 2.98 volts to a low voltage threshold Vt_LB 862 of 2.74 volts, which produces a bit distribution 863 of about 240 millivolts. A sensing window 855 between the high voltage threshold Vt_HB 854 of the logic 011 state and the low voltage threshold Vt_LB 862 of the logic 010 state is about 470 millivolts. In the logic 001 state 870, the voltage threshold ranges between a high voltage threshold Vt_HB 874 of 3.56 volts to a low voltage threshold Vt_LB 872 of 3.25 volts, which produces a bit distribution 873 of about 310 millivolts. A sensing window 865 between the high voltage threshold Vt_HB 864 of the logic 001 state and the low voltage threshold Vt_LB 872 of the logic 001 state is about 270 millivolts. In the logic 000 state 880, the voltage threshold ranges between a low voltage threshold Vt_LB 882 of 4 volts to a high voltage threshold Vt_HB 884 of 5 volts. A sensing window 875 between the high voltage threshold Vt_HB 874 of the logic 001 state and the low voltage threshold Vt_LB 882 of the logic 000 state is about 440 millivolts. A second bit operation window 800 of the multi-level cell memory device 500 in this embodiment is about 4 volts. A similar type of description is also applicable to a right side storage in the multi-level cell memory device 500. The multi-level cell memory device 500 has a total of six bits, with three bits on the left side and three bits on the right side.

FIG. 9 is a structural diagram illustrating the left side storage 540-4 in the multi-level cell memory device 500 designed with four bits for each side, eight bits per memory cell, and sixteen voltage threshold Vt states. The left side storage 540-4 stores four bits of information, which provides sixteen Boolean states, a logic "0000" state 960, a logic "0001" state 950, a logic "0010" state 940 ... a logic "1101" state 930, a logic "1110" state 920 and a logic "910" state. The four left bits in the left side storage 540-4 are programmed from the logic 1111 state 910 to the logic 0000 state 960. The logic 1111 state 910 is also referred to as a first voltage threshold state, the logic 1110 state 920 is also referred to as a second voltage threshold state, the logic 1101 state 930 is also referred to as a third voltage threshold state . . . , the logic 0010 state 940 is also referred to as a fourteenth voltage threshold state, the logic 0011 state 950 is also referred to as a fifteenth voltage threshold state, and the logic 0000 state 960 is also referred to as a sixteenth voltage threshold state. As an illustrated of voltage parameters, each bit distribution for a logic state or voltage threshold is about 150 millivolts and a sensing window between two voltage thresholds or logic states is about 200 millivolts. For example, the logic 1110 state has a bit distribution 913 of about 150 millivolts, a sense window 915 between the logic 1110 state and the logic 1111 state of about 200 millivolts, and a sense window between the logic 1110 state and the logic 1101 state of about 200 millivolts.

The selection of bit distributions and sensing windows for various logic states and between logic states can be the same or different. Specific parameter values of the bit distributions and sensing windows depend on the size of the second bit operation window. For example, suppose a second bit operation window 900 is about 5.2 volts, calculated as the difference between the left bit voltage threshold shift of 6.7 volts and the right bit voltage threshold shift of 1.5 volts after hole injection, the second bit operation window of 5.2 volts is divided among 15 sensing windows and 14 bit distributions in the multi-level cell memory device 500 that has sixteen logic states or voltage threshold.

Figure 10A:
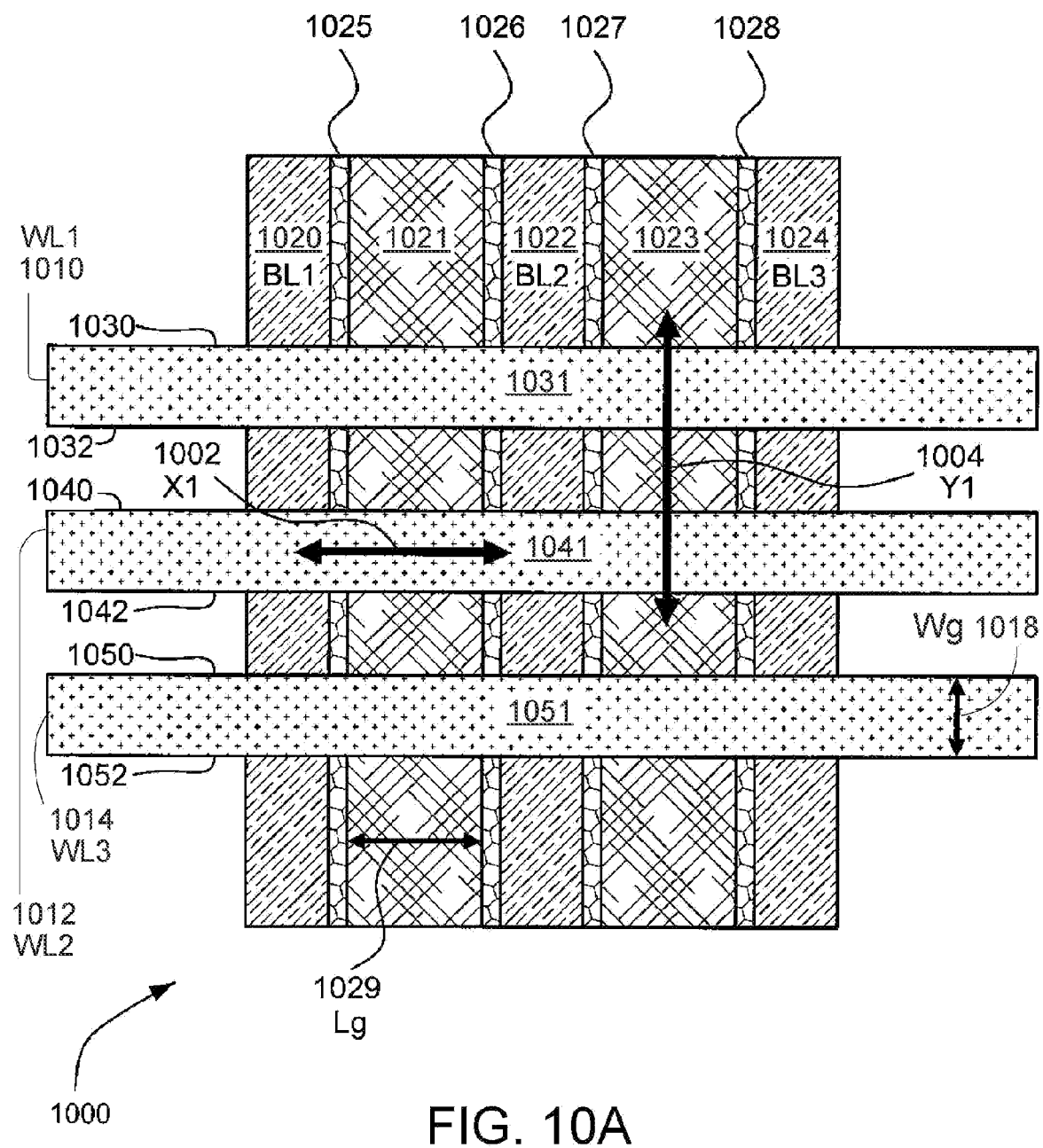
FIG. 10A is a structural diagram illustrating a top view in a first embodiment of a virtual ground array before a hole charge injection method is implemented on an MNOS memory in accordance with the present invention.

The large second bit operation window is a significant parameter in the design of an MLC memory device with high density capacity. One technique to obtain and expand the large second bit operation window is to use a fringe-induced barrier lowering (FIBL) effect. FIG. 10A is a structural diagram illustrating a top view in a first embodiment of a virtual ground array 1000 before a hole charge injection method implemented on a MNOS memory. The virtual ground array 1000 comprises a plurality of word lines (gates) WL1 1010, WL1 1012 and WL2 1014 extending in a horizontal direction, as show by an arrow X1 1002. Each of the WL1 1010, WL1 1012 and WL2 1014 has a width, represented by a symbol Wg 1018. The virtual ground array 1000 also includes a plurality of bit lines BL1 1020, BL2 1022 and BL3 1024, with a first charge trapping portion 1021 disposed between the bit lines BL1 1020, BL2 1022, and a second charge trapping portion 1023 disposed between the bit lines BL2 1022, BL3 1024, where they extend in a vertical direction, as shown by an arrow Y1 1004. Each of the charge trapping portions 1021, 1023 has a length, represented by a symbol Lg 1029. The first charge trapping portion 1021 and the second charge trapping portion 1023 are part of a charge trapping layer. In the intersection of the first charge trapping portion 1021 and the first, second, third word lines WL1 1010, WL2 1012, WL3 1014, a first dielectric strip 1025 and a second dielectric strip 1026 extend vertically on each side of the first charge trapping portion 1021. In the intersection of the second charge trapping portion 1023 and the first, second, third word lines WL1 1010, WL2 1012, WL3 1014, a third dielectric strip 1027 and a fourth dielectric strip 1028 extend vertically on each side of the second charge trapping portion 1023.

The first word line WL1 1010 has a first fringe 1030 and a second fringe 1032 with a non-fringe area 1031. Embodiments of the invention refer to the non-fringe area 1031 as an area that is away from the first fringe 1030 and away from the second fringe 1032 and may be substantially near the center 1031, which is between the first fringe 1030 and the second fringe 1032. The second word line WL2 1012 has a first fringe 1040 and a second fringe 1042 with a non-fringe area 1041. Embodiments of the invention refer to the non-fringe area 1041 as an area that is away from the first fringe 1040 and away from the second fringe 1042 and may be substantially near the center 1041, which is between the first fringe 1040 and the second fringe 1042. The third word line WL3 1014 has a first fringe 1050 and a second fringe 1052 with a non-fringe area 1051. Embodiments of the invention refer to the non-fringe area 1051 as an area that is away from the first fringe 1050 and away from the second fringe 1052 and may be substantially near the center 1051, which is between the first fringe 1050 and the second fringe 1052. The virtual ground array 1000 has not had a fringe induced effect because the hole charge injection has not been applied to the virtual ground array 1000.

Figure 10B:
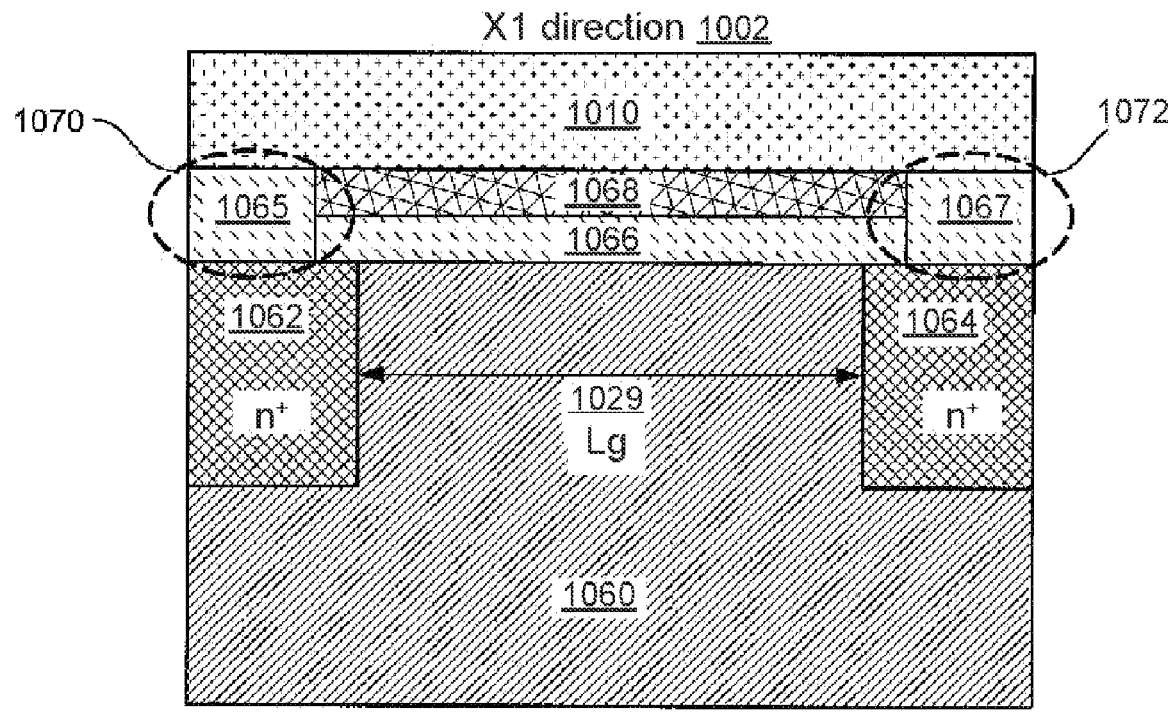
FIG. 10B illustrates a perspective view of the virtual ground array in the X1 direction without a charge trapping layer on source and drain junctions in accordance with the present invention.

FIG. 10B illustrates a perspective view of the virtual ground array 1000 in the X1 direction 1002 without a charge trapping layer on source and drain junctions. The virtual ground array 1000 comprises a substrate 1060 with a source region (n+) 1062 that is spaced apart from a drain region 1064 (n+) by the channel length Lg 1029. In this embodiment, a charge trapping layer 1068 neither extends all the way to the left to align with the left side of the substrate nor extends all the way to the right to align with the right side of the substrate. Rather, the charge trapping layer 1068 is disposed on the left with a first dielectric section 1065 and on the right with a second dielectric section 1067. The first dielectric section 1065 has the bottom surface in contact with the top surface of the source region 1062 and therefore provides no charge trapping layer, as shown by a dotted circle 1070. The second dielectric section 1067 has the bottom surface in contact with the top surface of the drain region 1064 and therefore provides no charge trapping layer, as shown by a dotted circle 1072. A dielectric layer 1066 also extends between the first and second dielectric sections 1065, 1067 and underlying the charge trapping layer 1068.

Figure 10C:
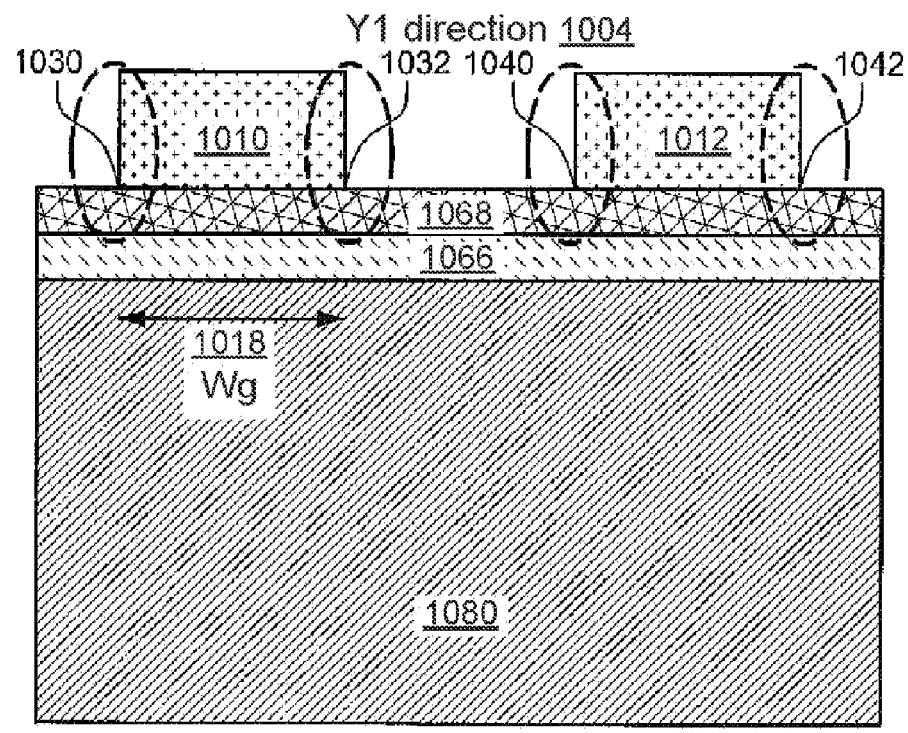
FIG. 10C illustrates a perspective view of the virtual ground array in the Y1 direction with the charge trapping layer on fringes of word lines in accordance with the present invention.

FIG. 10C illustrates a perspective view of the virtual ground array 1000 in the Y1 direction 1004 with the charge trapping layer 1068 on fringes of word lines. As observed from the Y1 direction 1004, the first word line WL1 1010 and the second word line WL2 1012 have bottom surfaces that are in contact with the charge trapping layer 1068. The charge trapping layer 1068 has a top surface that is in contact with the first and second fringes 1030, 1032 of the first word line 1010 and that is in contact with the first and second fringes 1040, 1042 of the second word line 1012.

Figure 11A:
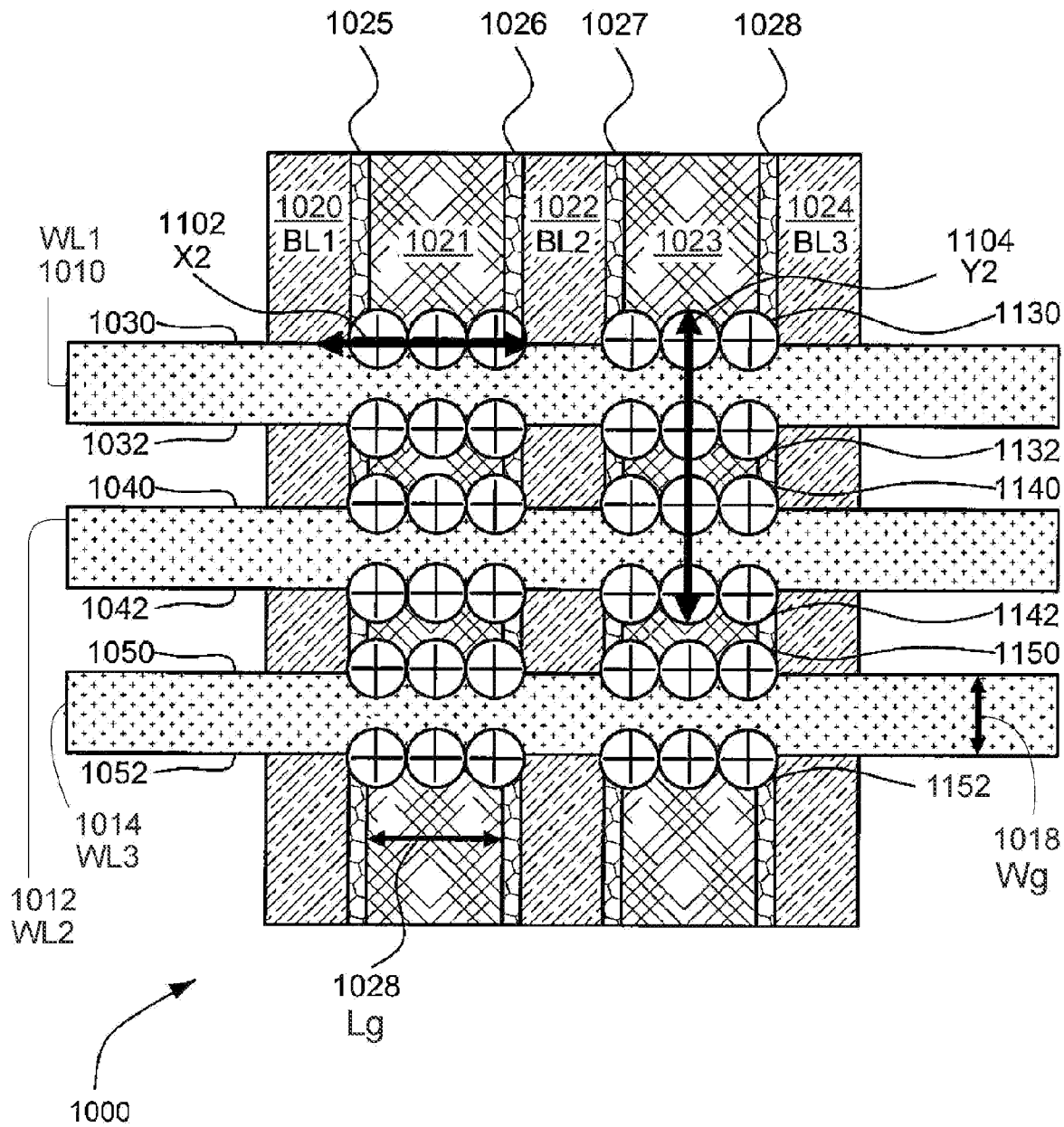
FIG. 11A is a structural diagram illustrating a top view in an embodiment of a virtual ground array showing fringe-induced effects after conducting a hole charge injection method to a multi-level cell memory device in accordance with the present invention.

FIG. 11A is a structural diagram illustrating a top view in the first embodiment of the virtual ground array 1000 after a hole charge injection method. After the hole charge injection method is performed, hole charges are stored along fringes of each word line because the fringes have a large electrical field in comparison to near the center of each word line. A plurality of hole charges 1130 are stored along the first fringe 1030 in the first word line WL1 1010 and intersect with the first charge trapping portion 1021 and the second charge trapping portion 1023. Hole charges are also stored along the other fringe of the word line. More specifically, a plurality of hole charges 1132 are stored along the second fringe 1032 in the first word line WL1 1010 and intersects with the first charge trapping portion 1021 and the second charge trapping portion 1023. With respect to the second word line WL2 1012, a plurality of hole charges 1140 is stored along the first fringe 1040 in the second word line WL2 1012 and intersects with the first charge trapping portion 1021 and the second charge trapping portion 1023. A plurality of hole charges 1142 are stored along the second fringe 1042 in the second word line WL2 1012 and intersects with the first charge trapping portion 1021 and the second charge trapping portion 1023. As for the third word line WL3 1014, a plurality of hole charges 1150 are stored along the first fringe 1050 in the third word line WL3 1014 and intersects with the first charge trapping portion 1021 and the second charge trapping portion 1023. A plurality of hole charges 1152 are stored along the second fringe 1052 in the third word line WL3 1014 and intersects with the first charge trapping portion 1021 and the second charge trapping portion 1023. The first fringe 1030 and the second fringe 1032 in the first word line WL1 1010, as well as other fringes in other word lines, enhance a drain induced barrier lowering (DIBL) effect to produce a larger second bit operation window.

Figure 11B:
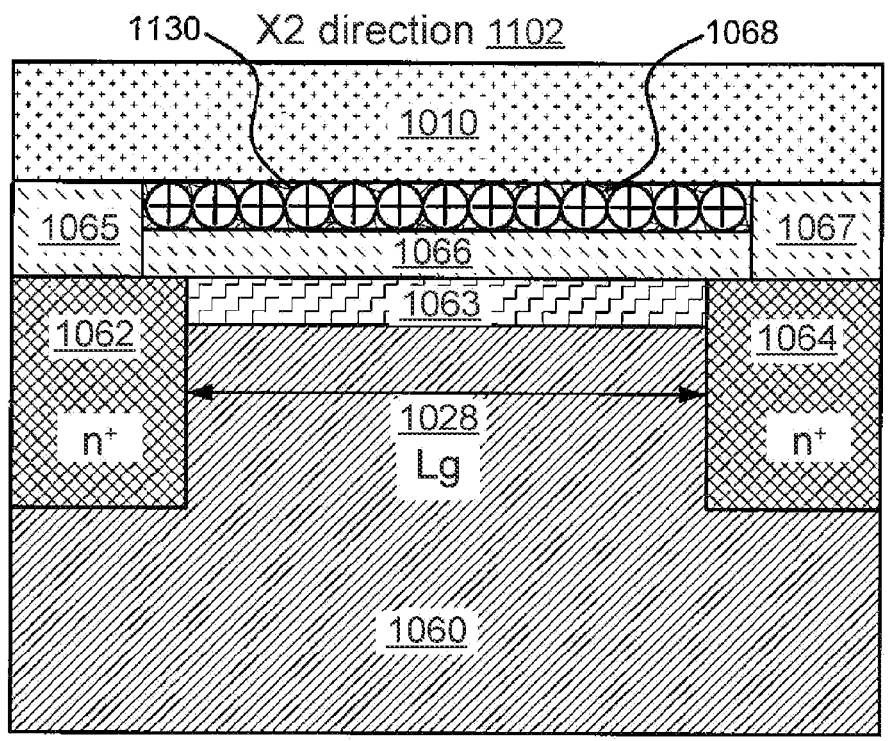
FIG. 11B is a perspective view of the virtual ground array with the hole charges stored on the charge trapping layer in the X2 direction in accordance with the present invention.

FIG. 11B illustrates a perspective view of the virtual ground array 1000 with the hole charges 1130 stored on the charge trapping layer 1068 in the X2 direction 1102. The hole charges 1130 cause a fringe or induced channel 1063 to have a lower voltage threshold level. The induced channel 1063 results in the virtual ground array 1000 being turned on such that the source and drain regions 1062, 1064 are conducting. The voltage threshold Vt typically dominates the device operation of the virtual ground array 1000.

Figure 11C:
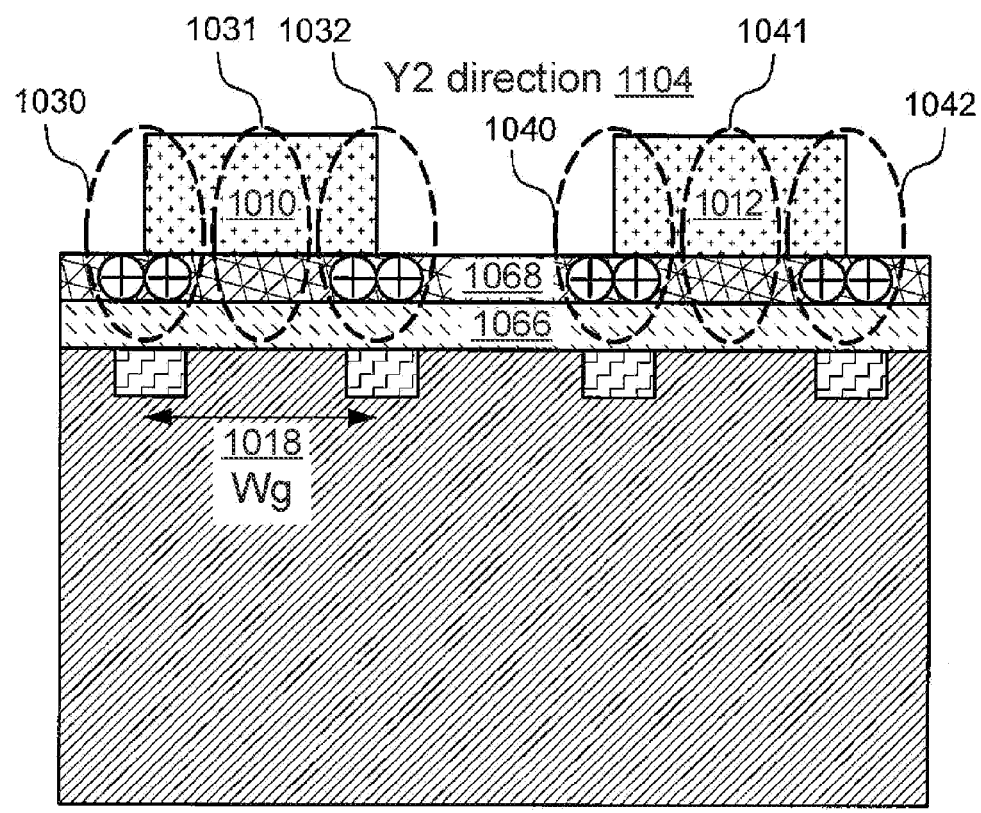
FIG. 11C is a perspective view of the virtual ground array in the Y2 direction with a charge storage layer on fringes of word lines in accordance with the present invention.

FIG. 11C illustrates a perspective view of the virtual ground array 1000 in the Y2 direction 1104 with a charge trapping layer on the fringes of word lines. As shown in the Y2 direction 1104, the first word line WL1 1010 and the second word line WL2 1012 have bottom surfaces that are in contact with the charge trapping layer 1068. The charge trapping layer 1068 has a top surface that is in contact with the first and second fringes 1030, 1032 of the first word line 1010 and in contact with the first and second fringes 1040, 1042 of the second word line 1012. The non-fringe area 1031 in the charge trapping layer and underneath the first word line 1010 does not store hole charges. Similarly, the non-fringe area 1041 in the charge trapping layer and underneath the first word line 1010 does not store hole charges.

Figure 12A:
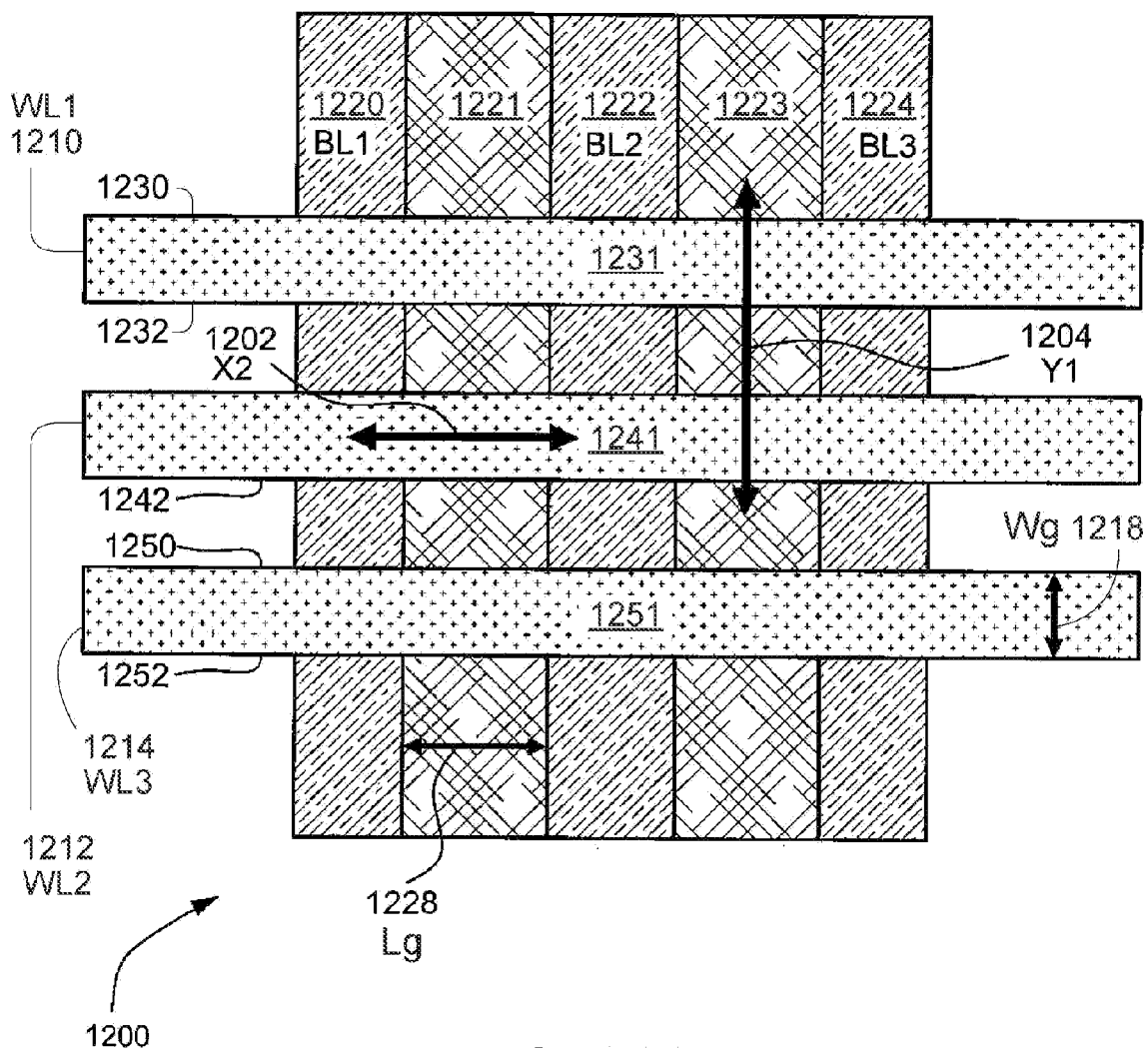
FIG. 12A is a structural diagram illustrating a top view in a second embodiment of a virtual ground array before a hole charge injection method is implemented on an MNOS memory in accordance with the present invention.

FIG. 12A is a structural diagram illustrating a top view in a second embodiment of a virtual ground array 1200 before a hole charge injection method is implemented on a MNOS memory. The virtual ground array 1200 comprises a plurality of word lines (gates) WL1 1210, WL2 1212 and WL3 1214 extending in a horizontal direction, as shown by an arrow X2 1202. Each of WL1 1210, WL2 1212 and WL3 1214 has a width, represented by a symbol Wg 1218. The virtual ground array 1200 also includes a plurality of bit lines BL1 1220, BL2 1222 and BL3 1224, with a first charge trapping portion 1221 disposed between the bit lines BL1 1220, BL2 1222, and a second charge trapping portion 1223 disposed between the bit lines BL2 1222, BL3 1224, where they extend in a vertical direction, as shown by an arrow Y1 1204. Each of the charge trapping portions 1221, 1223 has a length, represented by a symbol Lg 1228. The first charge trapping portion 1221 and the second charge trapping portion 1223 are part of a charge trapping layer.

The first word line WL1 1210 has a first fringe 1230 and a second fringe 1232 with a non-fringe area 1231. In other embodiments, the non-fringe area 1231 as an area that is away from the first fringe 1230 and away from the second fringe 1232 and may be substantially near the center 1231, which is between the first fringe 1230 and the second fringe 1232. The second word line WL2 1212 has a first fringe 1240 and a second fringe 1242 with a non-fringe area 1241. In other embodiments of the invention, the non-fringe area 1241 is an area that is away from the first fringe 1240 and away from the second fringe 1242 and maybe substantially near the center 1241, which is between the first fringe 1240 and the second fringe 1242. The third word line WL3 1214 has a first fringe 1250 and a second fringe 1252 with a non-fringe area 1251. In other embodiments of the invention, the non-fringe area 1251 is an area that is away from the first fringe 1250 and away from the second fringe 1252 and may be substantially near the center 1251, which is between the first fringe 1250 and the second fringe 1252. The virtual ground array 1200 has not had a fringe-induced effect because the hole charge injection has not been applied to the virtual ground array 1200.

Figure 12B:
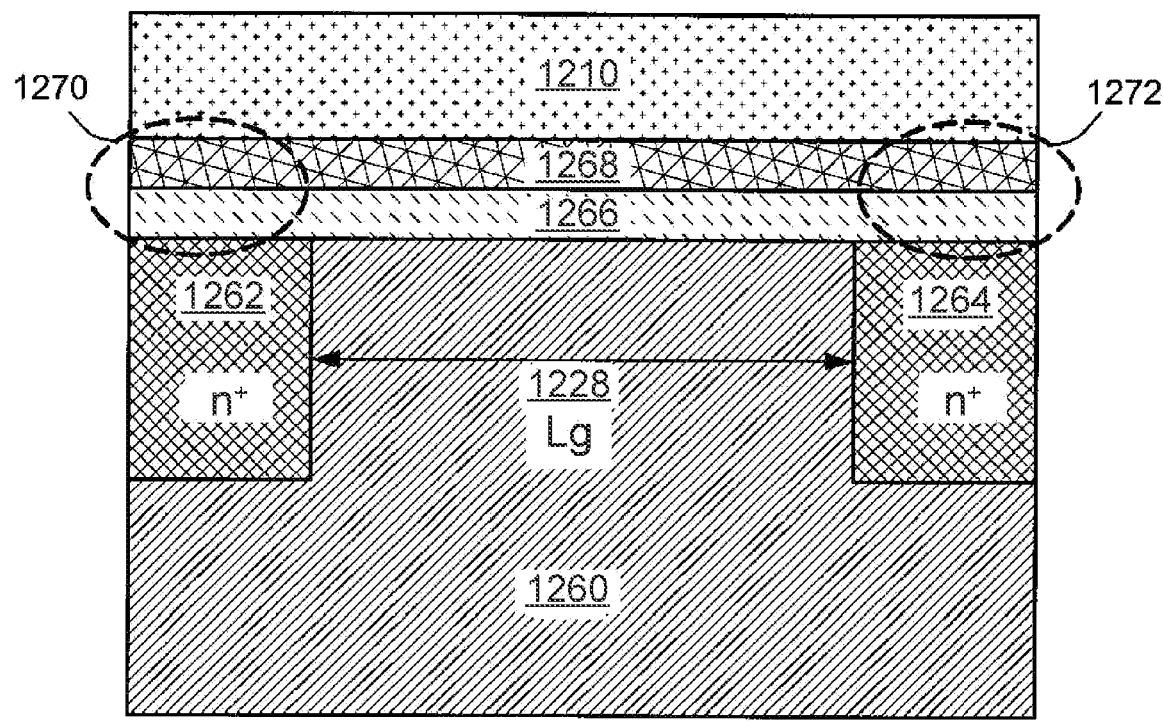
FIG. 12B illustrates a perspective view of the virtual ground array in the X1 direction with a charge trapping layer on source and drain junctions in accordance with the present invention.

FIG. 12B illustrates a perspective view of the virtual ground array 1200 in the X1 direction 1202 with a charge trapping layer on source and drain junctions. The virtual ground array 1200 comprises a substrate with a source region (n+) 1262 that is spaced apart from a drain region 1264 (n+) by the channel length Lg 1228. In this embodiment, a dielectric layer 1266 overlies the substrate 1260, and a charge trapping layer 1268 overlies the dielectric layer 1266, and the gate 1210 overlies the charge trapping layer 1268. In this embodiment, the charge trapping layer 1268 extends above the source region 1262, as indicated by a dotted circuit 1270, and extends above the drain region 1264, as indicated by a dotted circle 1272.

Figure 12C:
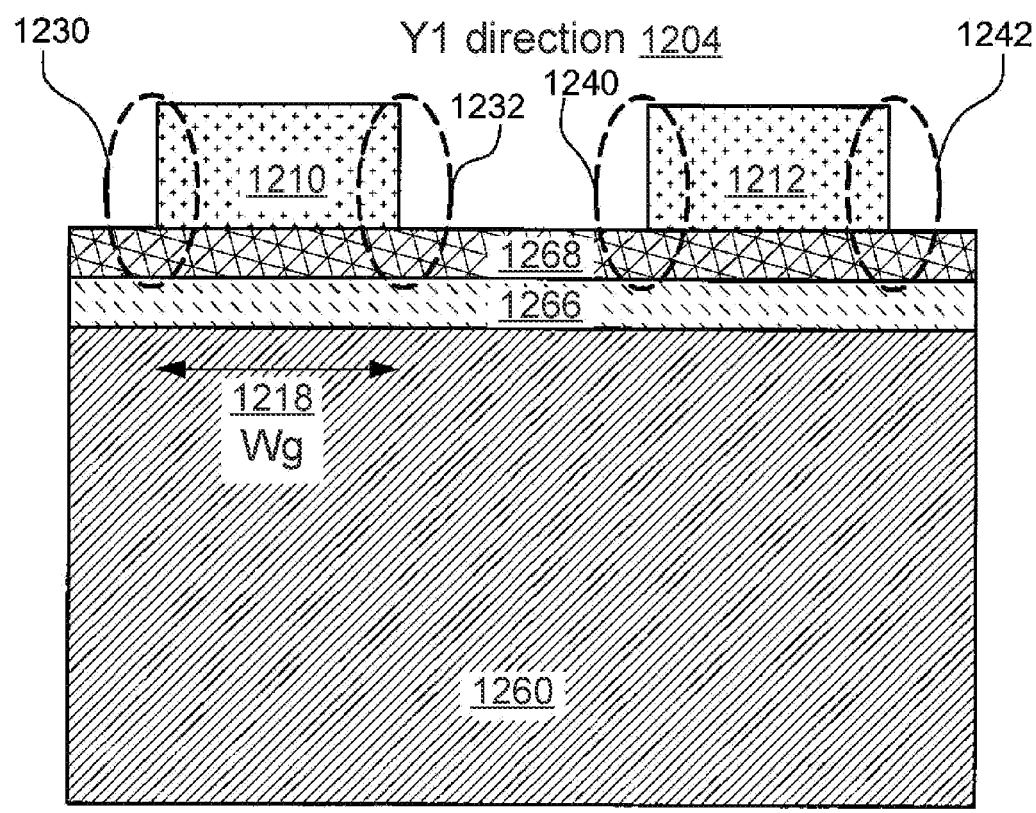
FIG. 12C illustrates a perspective view of the virtual ground array in the Y1 direction with the charge trapping layer on fringes of word lines in accordance with the present invention.

FIG. 12C illustrates a perspective view of the virtual ground array 1200 in the Y1 direction 1204 with the charge trapping layer 1268 on fringes of word lines. As observed from the Y1 direction 1204, the first word line WL1 1210 and the second word line WL2 1212 have bottom surfaces that are in contact with the charge trapping layer 1268. The charge trapping layer 1268 has a top surface that is in contact with the first and second fringes 1230, 1232 of the first word line 1210, which is in contact with the first and second fringes 1240, 1242 of the second word line 1212.

Figure 13A:
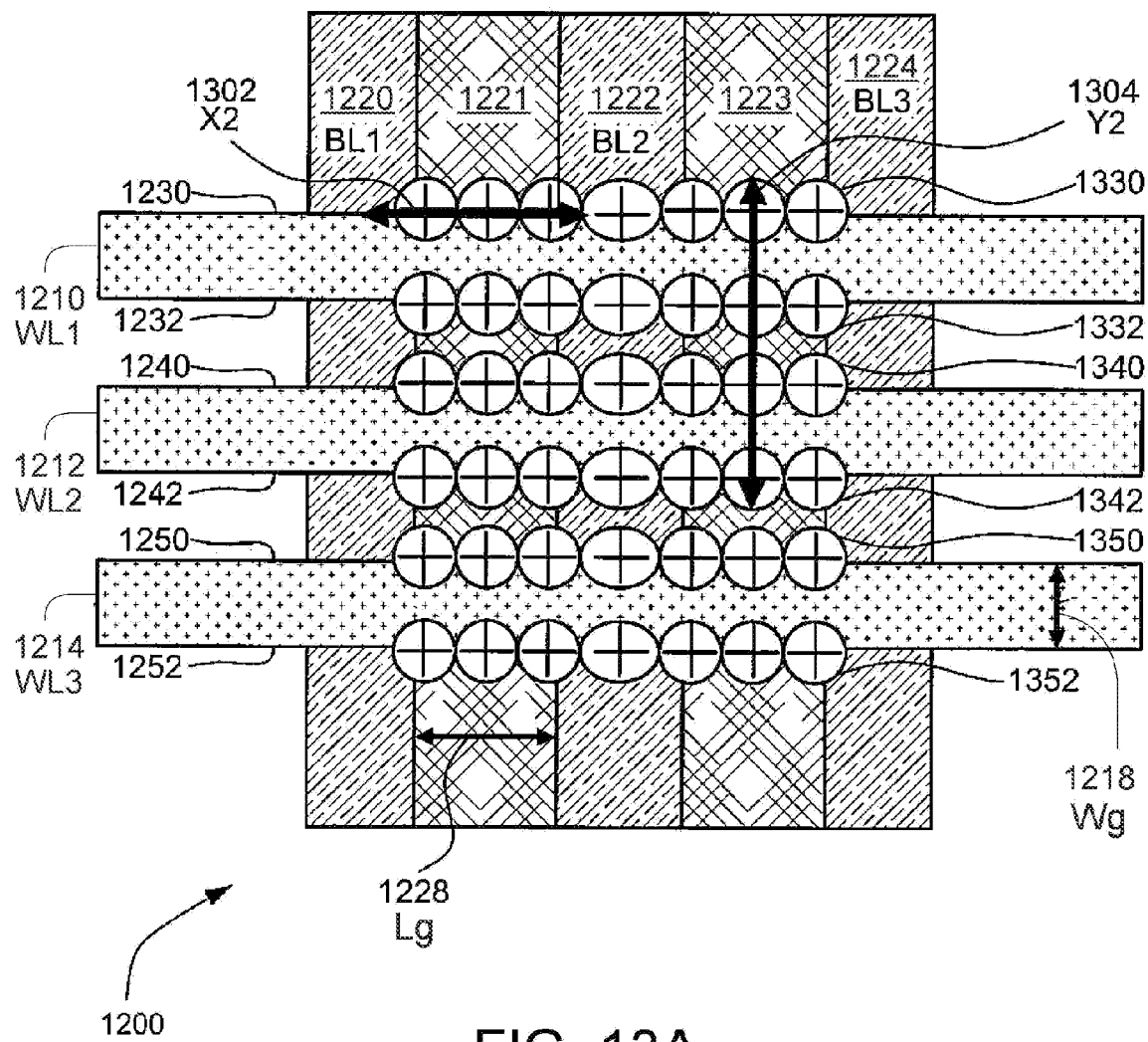
FIG. 13A is a structural diagram illustrating a top view in the second embodiment of the virtual ground array after a hole charge injection method has been conducted in accordance with the present invention.

FIG. 13A is a structural diagram illustrating a top view in the second embodiment of the virtual ground array 1200 after a hole charge injection method has been performed. After the hole charge injection, hole charges are stored along fringes of each word line because the fringes have a large electrical field in comparison to near the center of each word line. A plurality of hole charges 1330 are stored along the first fringe 1230 in the first word line WL1 1210 and intersect with the first charge trapping portion 1221 and the second charge trapping portion 1223. Hole charges are also stored along the other fringe of the word line. More specifically, a plurality of hole charges 1332 is stored along the second fringe 1232 in the first word line WL1 1210 and intersects with the first charge trapping portion 1221 and the second charge trapping portion 1223. With respect to the second word line WL2 1212, a plurality of hole charges 1340 is stored along the first fringe 1240 in the second word line WL2 1212 and intersects with the first charge trapping portion 1221 and the second charge trapping portion 1223. A plurality of hole charges 1342 is stored along the second fringe 1242 in the second word line WL2 1212 and intersects with the first charge trapping portion 1221 and the second charge trapping portion 1223. As for the third word line WL3 1214, a plurality of hole charges 1350 is stored along the first fringe 1250 in the third word line WL3 1214 and intersects with the first charge trapping portion 1221 and the second charge trapping portion 1223. A plurality of hole charges 1352 is stored along the second fringe 1252 in the third word line WL3 1214 and intersects with the first charge trapping portion 1221 and the second charge trapping portion 1223.

Figure 13B:
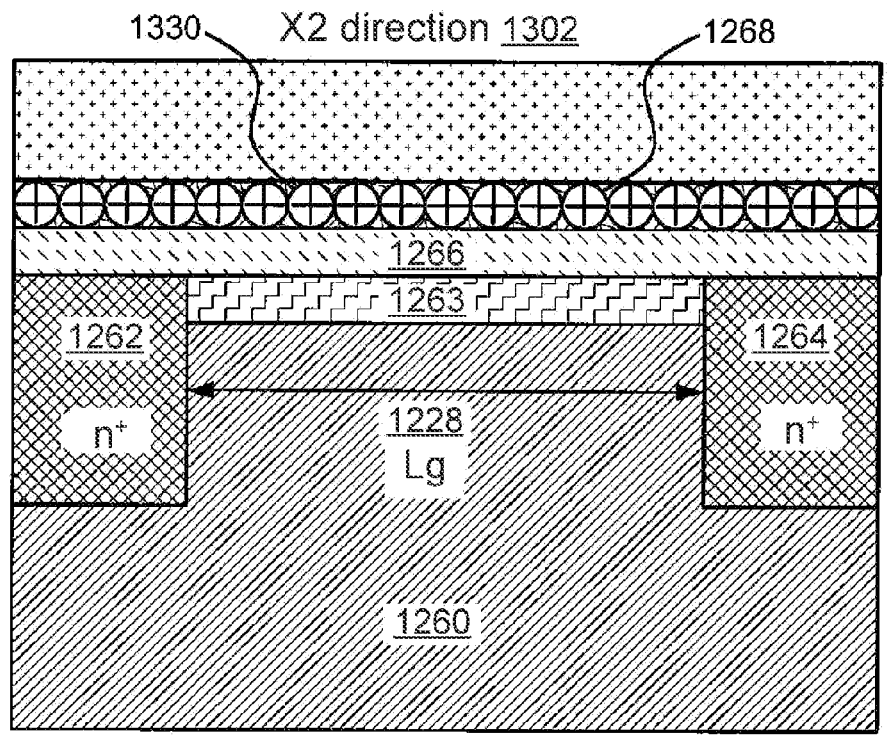
FIG. 13B illustrates a perspective view of the virtual ground array with the hole charges stored on the charge trapping layer in the X2 direction in accordance with the present invention.

FIG. 13B illustrates a perspective view of the virtual ground array 1200 with the hole charges 1330 stored on the charge trapping layer 1268 in the X2 direction 1302. The hole charges 1330 cause a fringe or induced channel to have a lower voltage threshold level. The induced channel 1263 means the virtual ground array 1200 is turned on such that the source and drain regions 1262, 1264 are conducting. The voltage threshold Vt typically dominates the device operation of the virtual ground array 1200.

Figure 13C:
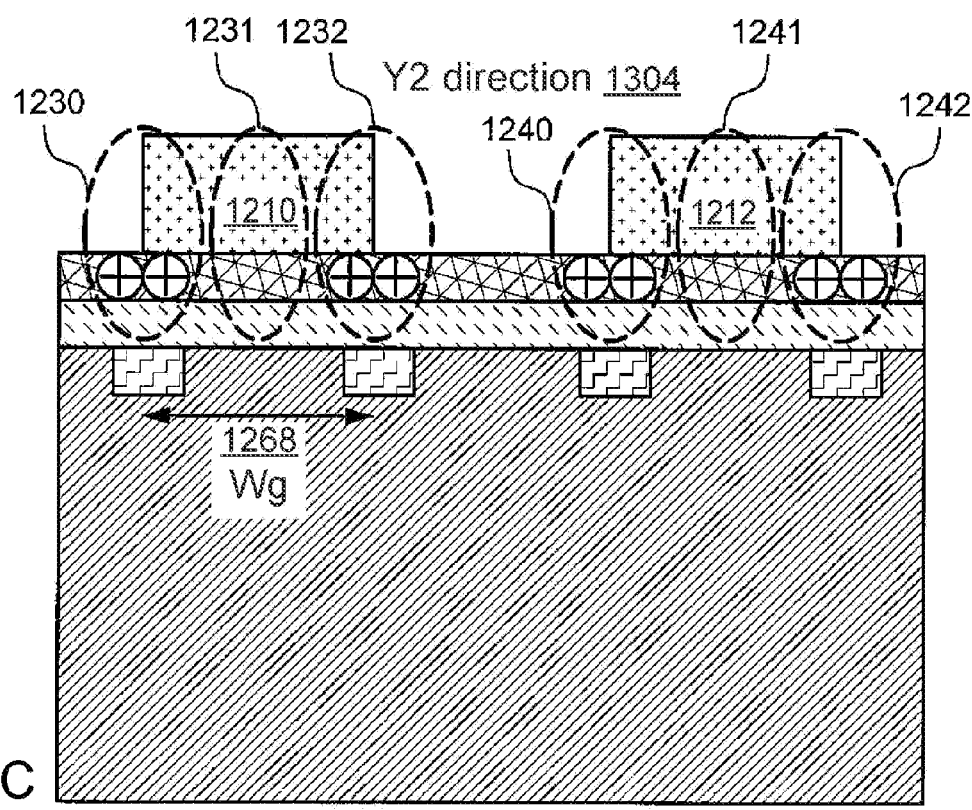
FIG. 13C illustrates a perspective view of the virtual ground array in the Y2 direction with a charge trapping layer on the fringes of word lines in accordance with the present invention.

FIG. 13C illustrates a perspective view of the virtual ground array 1200 in the Y2 direction 1304 with a charge trapping layer on the fringes of word lines. As shown in the Y2 direction 1304, the first word line WL1 1210 and the second word line WL2 1212 have bottom surfaces that are in contact with the charge trapping layer 1268. The charge trapping layer 1268 has a top surface that is in contact with the first and second fringes 1230, 1232 of the first word line 1210 and that is in contact with the first and second fringes 1240, 1242 of the second word line 1212. The non-fringe area 1231 in the charge trapping layer and underneath the first word line 1210 does not store hole charges. Similarly, the non-fringe area 1241 in the charge trapping layer and underneath the first word line 1210 does not store hole charges.

Figure 14:
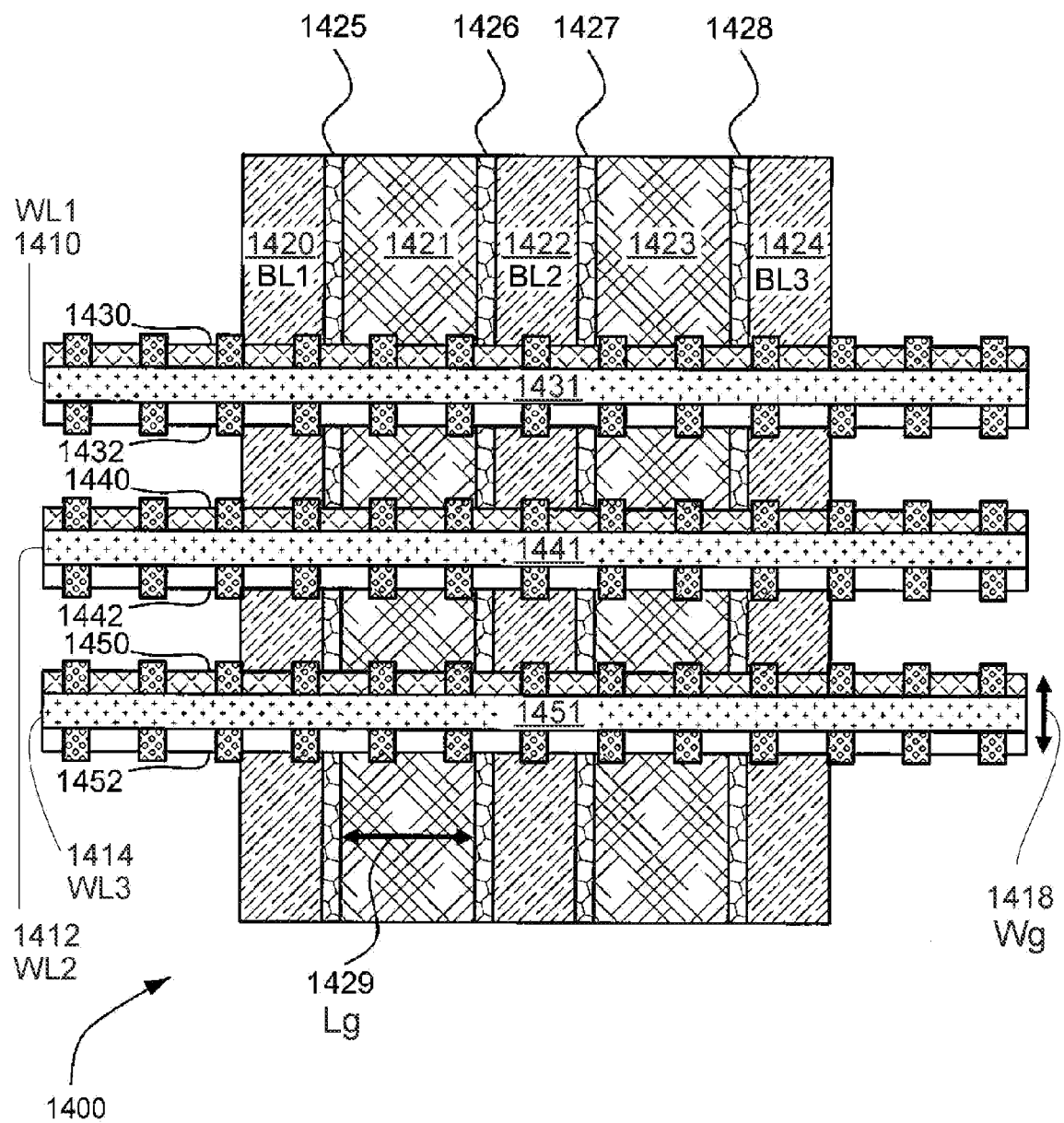
FIG. 14 is a structural diagram illustrating a top view in a third embodiment of a virtual ground array before a hole charge injection method has been performed on an MNOS memory as asymmetric voltage threshold levels along word lines in accordance with the present invention.

FIG. 14 is a structural diagram illustrating a top view in a third embodiment of a virtual ground array 1400 before a hole charge injection method is implemented on an MNOS memory as asymmetric voltage threshold levels along word lines. The virtual ground array 1400 comprises a plurality of word lines WL1 1410, WL2 1412 and WL3 1414 extending in a horizontal direction. Each of the WL1 1410, WL2 1412 and WL3 1414 has a width, represented by a symbol Wg 1418. The virtual ground array 1400 also includes a plurality of bit lines BL1 1420, BL2 1422 and BL3 1424, with a first charge trapping portion 1421 disposed between the bit lines BL1 1420, BL2 1422, and a second charge trapping portion 1423 disposed between the bit lines BL2 1422, BL3 1424, where they extend in a vertical direction. Each of the charge trapping portions 1421, 1423 has a length, represented by a symbol Lg 1429. The first charge trapping portion 1421 and the second charge trapping portion 1423 are part of a charge trapping layer. In the intersection of the first charge trapping portion 1421 and the first, second, third word lines WL1 1410, WL2 1412, WL3 1414, a first dielectric strip 1425 and a second dielectric strip 1426 extend vertically on each side of the first charge trapping portion 1421. In the intersection of the second charge trapping portion 1423 and the first, second, third word lines WL1 1410, WL2 1412, WL3 1414, a third dielectric strip 1427 and a fourth dielectric strip 1428 extend vertically on each side of the second charge trapping portion 1423.

The first word line WL1 1410 has a first fringe 1430 as depicted by dotted square lines, and a second fringe 1432 as depicted with dotted square lines, with a non-fringe area 1431 as depicted by a solid line. Embodiments of the invention refer to the non-fringe area 1431 as an area that is away from the first fringe 1430 and away from the second fringe 1432 and may be substantially near the center 1431, which is between the first fringe 1430 and the second fringe 1432. The second word line WL2 1412 has a first fringe 1440 as depicted with dotted square lines, a second fringe 1442 as depicted with dotted square lines, and a non-fringe area 1441 as depicted by a solid line. Embodiments of the invention refer to the non-fringe area 1441 as an area that is away from the first fringe 1440 and away from the second fringe 1442 and may be substantially near the center 1441, which is between the first fringe 1440 and the second fringe 1442. The third word line WL3 1414 has a first fringe 1450 as depicted with dotted square lines, a second fringe 1452 as depicted with dotted square lines, and a non-fringe area 1451 as depicted by a solid line. In other embodiments of the invention, the non-fringe area 1451 is an area that is away from the first fringe 1450 and away from the second fringe 1452 and may be substantially near the center 1451, which is between the first fringe 1450 and the second fringe 1452. The virtual ground array 1400 has not had a fringe-induced effect because the hole charge injection has not been applied to the virtual ground array 1400.

Each of the word lines WL1 1410, WL2 1412, WL3 1414 is associated with two voltage threshold levels, a fringe voltage threshold level as represented by the symbol $Vt_{fringe}$, and a non-fringe voltage threshold level as represented by the symbol $Vt_{non-infringe}$. In some embodiments, the fringes 1430, 1432 are associated with the fringe voltage threshold level $Vt_{fringe}$ and the non-fringe area 1431 is associated with the non-fringe voltage threshold $Vt_{non-infringe}$. Typically a lower voltage threshold level dominates a device operation behavior. In order to operate the virtual ground array 1400 at fringes of a word line, the fringe voltage threshold $Vt_{fringe}$ is less than the non-fringe voltage threshold $Vt_{non-fringe}$.

Figure 15:
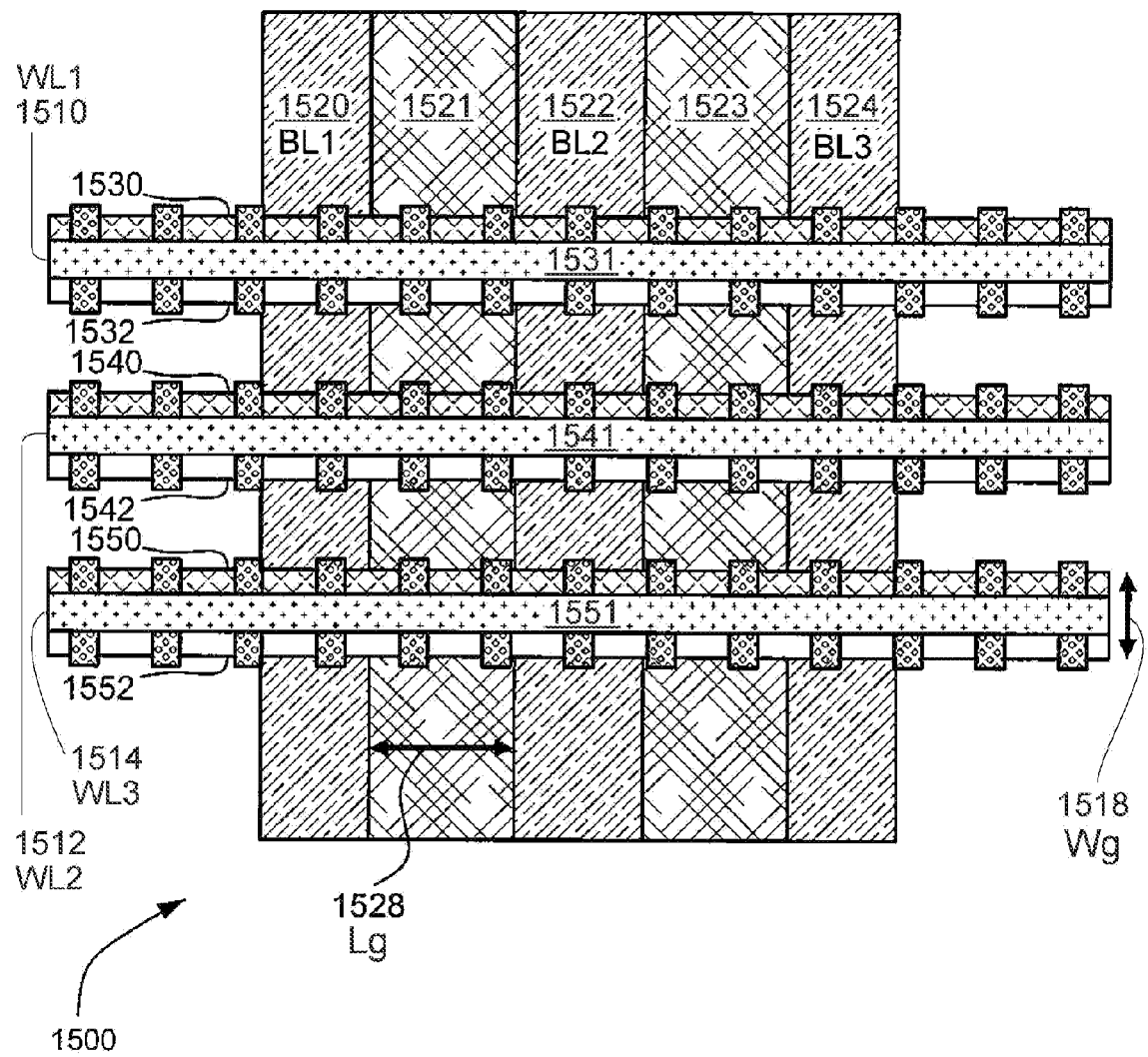
FIG. 15 is a structural diagram illustrating a top view in a fourth embodiment of a virtual ground array before a hole charge injection method has been performed on an MNOS memory as asymmetric voltage threshold levels along word lines in accordance with the present invention.

FIG. 15 is a structural diagram illustrating a top view in a fourth embodiment of a virtual ground array 1500 before a hole charge injection method is implemented on an MNOS memory as asymmetric voltage threshold levels along word lines. The virtual ground array 1500 comprises a plurality of word lines WL1 1510, WL2 1512 and WL3 1514 extending in a horizontal direction. Each of the word lines WL1 1510, WL2 1512 and WL3 1514 has a width, represented by a symbol Wg 1518. The virtual ground array 1500 also includes a plurality of bit lines BL1 1520, BL2 1522 and BL3 1524, with a first charge trapping portion 1521 disposed between the bit lines BL1 1520, BL2 1522, and a second charge trapping portion 1523 disposed between the bit lines BL2 1522, BL3 1524, where they extend in a vertical direction. Each of the charge trapping portions 1521, 1523 has a length, represented by a symbol Lg 1528. The first charge trapping portion 1521 and the second charge trapping portion 1523 are part of a charge trapping layer.

The first word line WL1 1510 has a first fringe 1530 depicted by dotted square lines, and a second fringe 1532 depicted with dotted square lines, with a non-fringe area 1531 depicted by a solid line. Embodiments of the invention refer to the non-fringe area 1531 as an area that is away from the first fringe 1530 and away from the second fringe 1532 and may be substantially near the center 1531, which is between the first fringe 1530 and the second fringe 1532. The second word line WL2 1512 has a first fringe 1540 depicted with dotted square lines, a second fringe 1542 depicted with dotted square lines, and a non-fringe area 1541 depicted by a solid line. Embodiments of the invention refer to the non-fringe area 1541 as an area that is away from the first fringe 1540 and away from the second fringe 1542 and may be substantially near the center 1541, which is between the first fringe 1540 and the second fringe 1542. The third word line WL3 1514 has a first fringe 1550 depicted with dotted square lines, a second fringe 1552 depicted with dotted square lines, and a non-fringe area 1551 depicted by a solid line. Embodiments of the invention refer to the non-fringe area 1551 as an area that is away from the first fringe 1550 and away from the second fringe 1552 and may be substantially near the center 1551, which is between the first fringe 1550 and the second fringe 1552. The virtual ground array 1500 has not had a fringe-induced effect because the hole charge injection has not been applied to the virtual ground array 1500.

Each of the word lines WL1 1510, WL2 1512, WL3 1514 is associated with two voltage threshold levels, a fringe voltage threshold level represented by a symbol $Vt_{fringe}$, and a non-fringe voltage threshold level represented by a symbol Vt$_{non-fringe}$. In some embodiments, the fringes 1530, 1532 associated with the fringe voltage threshold level Vt$_{fringe}$ and the non-fringe 1531 area are associated with the non-infringe voltage threshold Vt$_{non-infringe}$. Typically a lower voltage threshold level dominates a device operation behavior. In order to operate the virtual ground array 1500 at fringes of a word line, the fringe voltage threshold Vt$_{fringe}$ is less than the non-fringe voltage threshold Vt$_{non-infringe}$.

For additional information on the hole injection methods and second bit effect of a charge trapping memory that stores multiple bits per cell, see U.S. patent application Ser. No. 11/425,482 entitled "Methods and Structures for Expanding a Memory Operation Window and Reducing a Second Bit Effect", filed on 21 Jun. 2006 (concurrent with the provisional parent of the instant application), owned by the assignee of this application and incorporated by reference as if fully set forth herein.

An ordinary artisan should require no additional explanation in developing the methods and systems described herein but may nevertheless find some possibly helpful guidance in the preparation of these methods and systems by examining standard reference works in the relevant art.

The invention has been described with reference to specific exemplary embodiments. Various modifications, adaptations, and changes may be made without departing from the spirit and scope of the invention. Accordingly, the specification and drawings are to be regarded as illustrative of the principles of this invention rather than limiting, the invention is defined by the following appended claims.

I claim:

1. A method for operating a multi-level-cell (MLC) memory device, comprising
   a substrate;
   a gate electrode; and
   a charge trapping structure disposed between the substrate and the gate electrode and having a second bit operation window, the charge trapping structure having a first storage side space apart from a second storage side, the first storage side having m bits for 2$^m$ multiple voltage threshold Vt distributions and a plurality of sensing windows, each sensing window in the first storage side defining a voltage margin between two voltage threshold Vt distributions; the method comprising:
   enlarging the second bit operation window by a hole injection that move holes to the charge trapping layer; and
   wherein the hole injection comprises one of applying a positive gate voltage to erase the memory device to a negative voltage level by moving holes from the gate electrode to the charge trapping structure, and of applying a negative gate voltage to erase the memory device to a negative voltage level by moving holes from the substrate to the charge trapping structure.

2. The method for operating a MLC memory device of claim 1, wherein the second storage side stores m bits for 2$^m$ multiple voltage threshold Vt distributions and a plurality of sensing windows, each sensing window in the first storage side defining a voltage margin between two voltage threshold Vt distributions.

3. The method for operating a MLC memory device of claim 1, wherein the charge trapping structure stores two bits, the first bit on the first storage side to provide a logic 0 state and a logic 1 state, the multiple voltage threshold Vt distributions including a first voltage threshold distribution and a second voltage threshold distribution, the second bit operation window measured between the first and second voltage threshold distributions.

4. The method for operating a MLC memory device of claim 1, wherein the charge trapping structure stores four bits, the first storage side having two bits to provide a logic 00 state, a logic 01 state, a logic 10 state and a logic 11 state, the multiple voltage threshold Vt distributions including a first voltage threshold distribution corresponding to the logic 11 state, a second voltage threshold distribution corresponding to the logic 10 state, a third voltage threshold distribution corresponding to the logic 01 state, and a fourth voltage threshold distribution corresponding to the logic 00 state,
   wherein the second bit operation window measured between the first and fourth voltage threshold distributions, the second bit operation window includes the second voltage threshold distribution, the third voltage threshold distribution, a first sensing window providing a first voltage margin between the logic 10 and 11 states, a second sensing window a second voltage margin between the logic 10 and 01 states, and a third sensing window providing a third voltage margin between the logic 01 and 00 states.

5. The method for operating a MLC memory device of claim 1, wherein the charge trapping structure stores six bits, the first storage side having three bits to provide a logic 000 state, a logic 001 state, a logic 010 state, a logic 011 state, a logic 100 state, a logic 101 state, a logic 110 state, and a logic 111 state, the multiple voltage threshold Vt distributions including a first voltage threshold distribution corresponding to the logic 111 state, a second voltage threshold distribution corresponding to the logic 110 state, a third voltage threshold distribution corresponding to the logic 101 state, and a fourth voltage threshold distribution corresponding to the logic 100 state, a fifth voltage threshold distribution corresponding to the logic 011 state, a sixth voltage threshold distribution corresponding to the logic 010 state, a seventh voltage threshold distribution corresponding to the logic 001 state, and an eighth voltage threshold distribution corresponding to the logic 000 state,
   wherein the second bit operation window measured between the first and eighth voltage threshold distributions, the second bit operation window includes the second, the third, the fourth, the fifth, the sixth, and the seventh voltage threshold distributions, a first sensing window providing a first voltage margin between the logic 111 and 110 states, a second sensing window providing a second voltage margin between the logic 110 and 101 states, a third sensing window providing a third voltage margin between the logic 101 and 100 states, a fourth sensing window providing a fourth voltage margin between the logic 101 and 100 states, a fifth sensing window providing a fifth voltage margin between the logic 100 and 011 states, a sixth sensing window providing a sixth voltage margin between the logic 011 and 010 states, a seventh sensing window providing a seventh voltage margin between the logic 010 and 001 states, and an eighth sensing window providing an eighth voltage margin between the logic 001 and 000 states.

6. The method for operating a MLC memory device of claim 1, wherein the charge trapping structure stores eight bits, the first storage side having four bits to provide a logic 0000 state, a logic 0001 state, a logic 0010 state, a logic 0011 state, a logic 0100state, a logic 0101 state, a logic 0110 state, a logic 0111 state, a logic 1000 state, a logic 1001state, a logic 1010 state, a logic 1011 state, a logic 1100 state, a logic 1101 state, a logic 1110state, a logic 1111 state, the multiple voltage threshold Vt distributions including a first voltage threshold distribution corresponding to the logic 1111 state, a second voltage threshold distribution corresponding to the logic 1110 state, a third voltage threshold distribution corresponding to the logic 1101 state, and a fourth voltage threshold distribution corresponding to the logic 1100 state, a fifth voltage threshold distribution corresponding to the logic 1011 state, a sixth voltage threshold distribution corresponding to the logic 1010 state, a seventh voltage threshold distribution corresponding to the logic 1001 state, and an eighth voltage threshold distribution corresponding to the logic 1000 state, a ninth voltage threshold distribution corresponding to the logic 0111 state, a tenth voltage threshold distribution corresponding to the logic 0110 state, an eleventh voltage threshold distribution corresponding to the logic 0101 state, and a twelfth voltage threshold distribution corresponding to the logic 0100 state, a thirteenth voltage threshold distribution corresponding to the logic 0011 state, a fourteenth voltage threshold distribution corresponding to the logic 0010 state, a fifteenth voltage threshold distribution corresponding to the logic 0001 state, and a sixteenth voltage threshold distribution corresponding to the logic 0000 state, wherein the second bit operation window measured between the first and sixteenth voltage threshold distributions, the second bit operation window includes the second, the third, the fourth, the fifth, the sixth, the seventh, the eighth, the ninth, the tenth, the eleventh, the twelfth, the thirteenth, the fourteenth, the fifteen, and the sixteenth voltage threshold distributions, a first sensing window providing a first voltage margin between the logic 1111 and 1110 states, a second sensing window providing a second voltage margin between the logic 1110 and 1101 states, a third sensing window providing a third voltage margin between the logic 1101 and 1100 states, a fourth sensing window providing a fourth voltage margin between the logic 1101 and 1100 states, a fifth sensing window providing a fifth voltage margin between the logic 1100 and 1011 states, a sixth sensing window providing a sixth voltage margin between the logic 1011 and 1010 states, a seventh sensing window providing a seventh voltage margin between the logic 1010 and 1001 states, an eighth sensing window providing an eighth voltage margin between the logic 1001 and 1000 states, a ninth sensing window providing a ninth voltage margin between the logic 1000 and 0111 states, a tenth sensing window providing a tenth voltage margin between the logic 0111 and 0110 states, an eleventh sensing window providing an eleventh voltage margin between the logic 0110 and 0101 states, a twelfth sensing window providing a twelfth voltage margin between the logic 0101 and 0100 states, a thirteenth sensing window providing a thirteenth voltage margin between the logic 0100 and 0011 states, a fourteenth sensing window providing a fourteenth voltage margin between the logic 0011 and 0010 states, a fifteenth sensing window providing a fifteenth voltage margin between the logic 0010 and 0001 states, and a sixteenth sensing window providing a sixteenth voltage margin between the logic 0001 and 0000 states.

7. The method for operating a MLC memory device of claim 1, wherein the charge trapping structure comprises a charge trapping layer overlying a dielectric layer.

8. The method for operating a MLC memory device of claim 1, wherein the charge trapping structure comprises a top dielectric layer overlying a charge trapping layer, and the charge trapping layer overlying a bottom dielectric layer.

9. The method for operating a MLC memory device of claim 8, further comprising a first dielectric section and a second dielectric section, the charge trapping layer disposed between the first and second dielectric sections.

10. A method for operating a charge trapping memory cell, comprising:
    setting a cell threshold voltage to a level within a first voltage threshold Vt distribution including negative voltages for a first memory state by hole tunneling; and
    setting the cell threshold voltage to a level within a second voltage threshold Vt distribution higher than the first voltage threshold Vt distribution for a second memory state.

* * * * *